United States Patent
Mitsui et al.

(10) Patent No.: US 10,845,439 B2
(45) Date of Patent: Nov. 24, 2020

(54) MAGNETIC RESONANCE IMAGING APPARATUS USING POSITIONAL INFORMATION BASED ON AN IMAGE OBTAINED BY RECONSTRUCTING A MAGNETIC RESONANCE SIGNAL

(71) Applicant: CANON MEDICAL SYSTEMS CORPORATION, Otawara (JP)

(72) Inventors: Shinji Mitsui, Nasushiobara (JP); Masahiro Fukushima, Utsunomiya (JP); Satoshi Imai, Nasushiobara (JP); Miyuki Ota, Otawara (JP); Sadanori Tomiha, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/360,591

(22) Filed: Mar. 21, 2019

(65) Prior Publication Data

US 2019/0302201 A1    Oct. 3, 2019

(30) Foreign Application Priority Data

Mar. 28, 2018 (JP) .................................. 2018-061610
Mar. 13, 2019 (JP) .................................. 2019-045858

(51) Int. Cl.
| | | |
|---|---|---|
| *G01R 33/36* | (2006.01) | |
| *G01R 33/34* | (2006.01) | |
| *G01R 33/385* | (2006.01) | |
| *G01R 33/54* | (2006.01) | |
| *G01R 33/58* | (2006.01) | |

(52) U.S. Cl.
CPC ............. *G01R 33/36* (2013.01); *G01R 33/34* (2013.01); *G01R 33/385* (2013.01); *G01R 33/54* (2013.01); *G01R 33/583* (2013.01)

(58) Field of Classification Search
CPC ...... G01R 33/36; G01R 33/34; G01R 33/385; G01R 33/54; G01R 33/583; G01R 33/543; G01R 33/3657; G01R 33/3415
See application file for complete search history.

(56) References Cited

U.S. PATENT DOCUMENTS

| | | | |
|---|---|---|---|
| 4,806,867 A | 2/1989 | Hanawa et al. | |
| 2010/0176800 A1* | 7/2010 | Biber | G01R 33/341 324/207.13 |
| 2010/0182005 A1* | 7/2010 | Biber | A61B 5/064 324/307 |
| 2011/0101980 A1* | 5/2011 | Ohiwa | G01R 33/4833 324/309 |
| 2016/0154074 A1 | 6/2016 | Okamoto | |

(Continued)

FOREIGN PATENT DOCUMENTS

| | | |
|---|---|---|
| JP | 2010-119744 | 6/2010 |
| JP | 2014-061176 | 4/2014 |

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry generates positional information related to a positional relationship between a transmitter coil and a receiver coil based on a magnetic resonance signal received from a subject. The processing circuitry adjusts an irradiation intensity of an RF pulse to be irradiated on the subject in accordance with the positional information.

16 Claims, 15 Drawing Sheets

(56) References Cited

U.S. PATENT DOCUMENTS

| | | | |
|---|---|---|---|
| 2017/0097396 A1* | 4/2017 | Harvey | A61B 5/0035 |
| 2018/0003791 A1* | 1/2018 | Kimmlingen | G01R 33/36 |
| 2018/0143271 A1* | 5/2018 | Xu | G01C 3/08 |

* cited by examiner

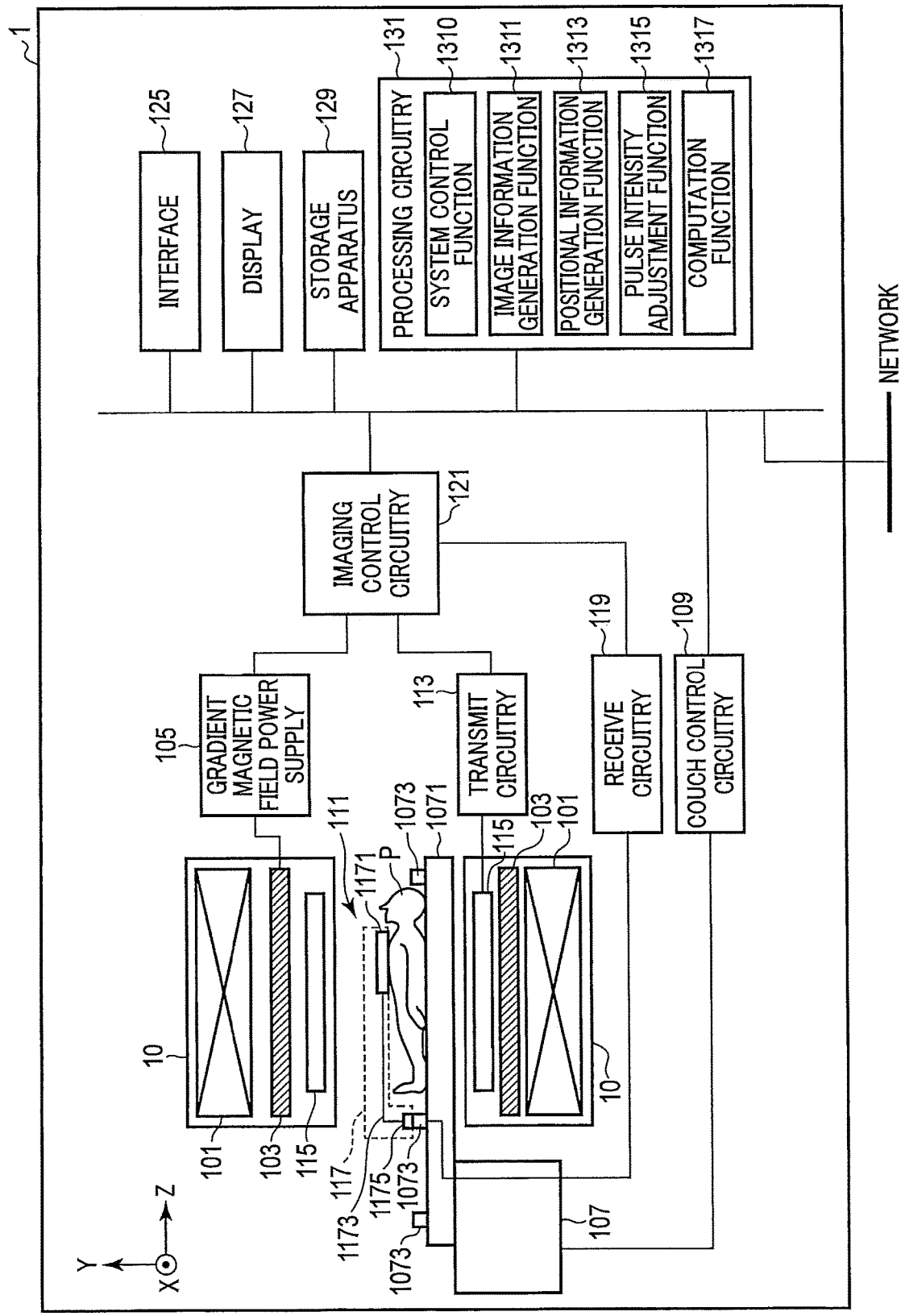
F I G. 1

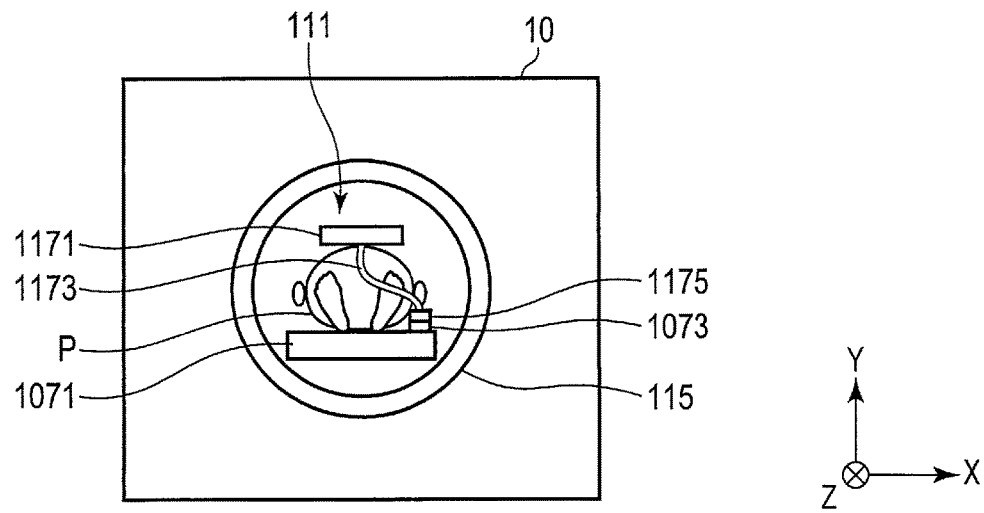
F I G. 5
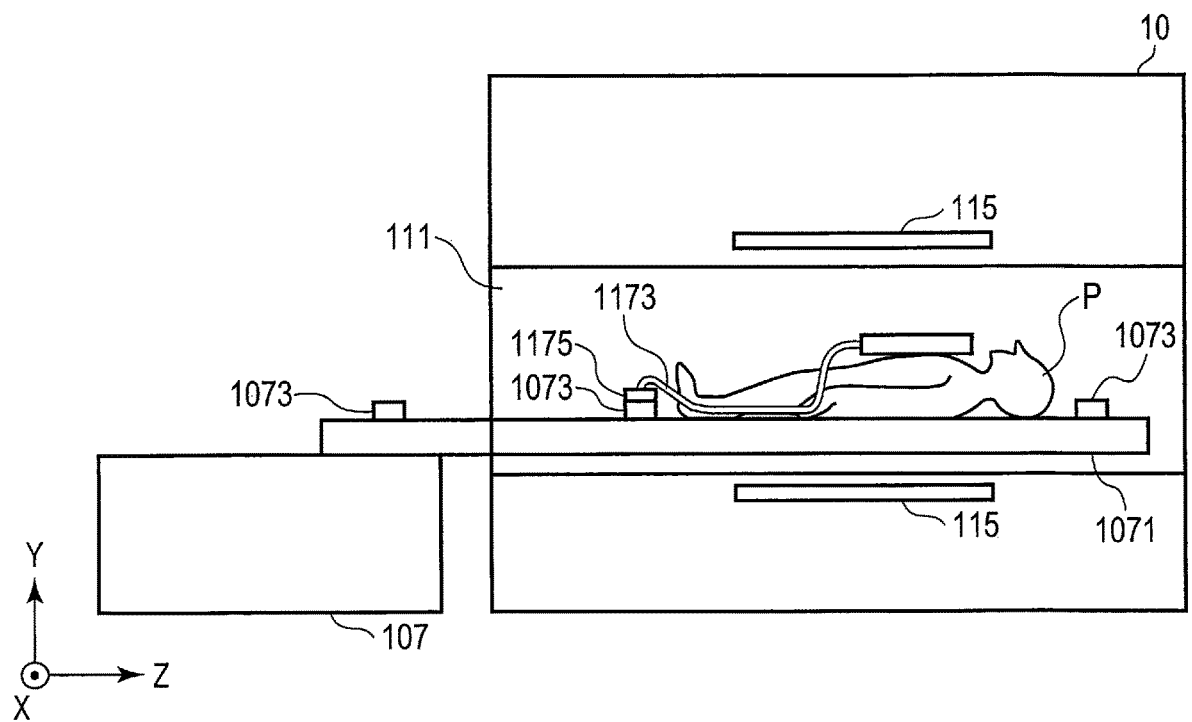
F I G. 6

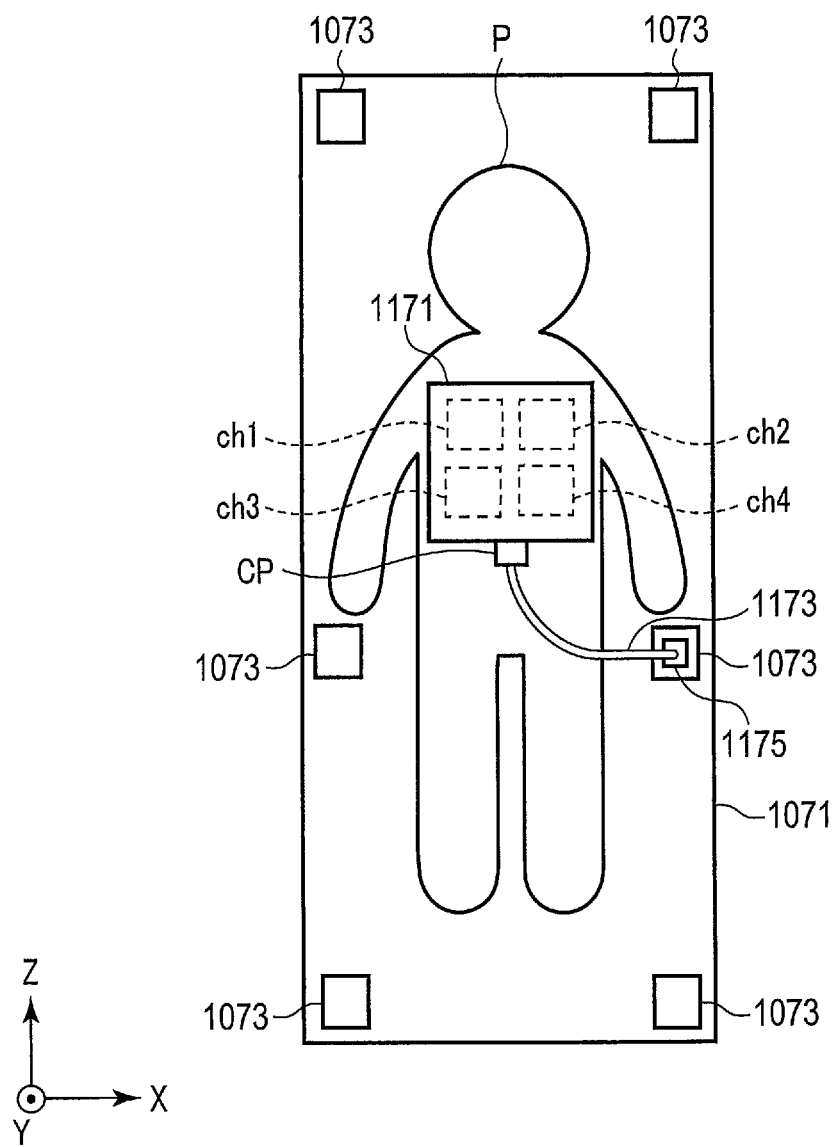
F I G. 9

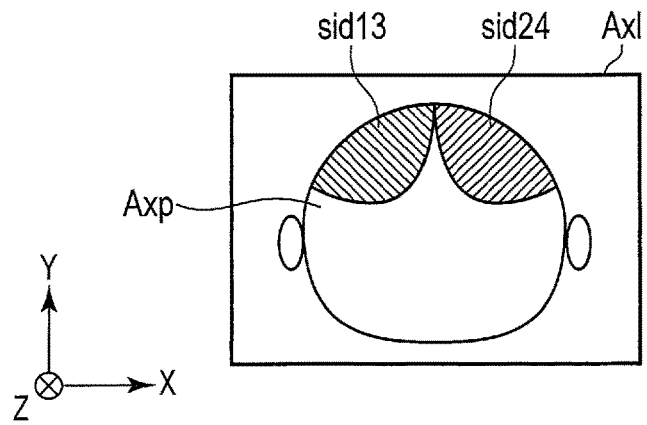
F I G. 10
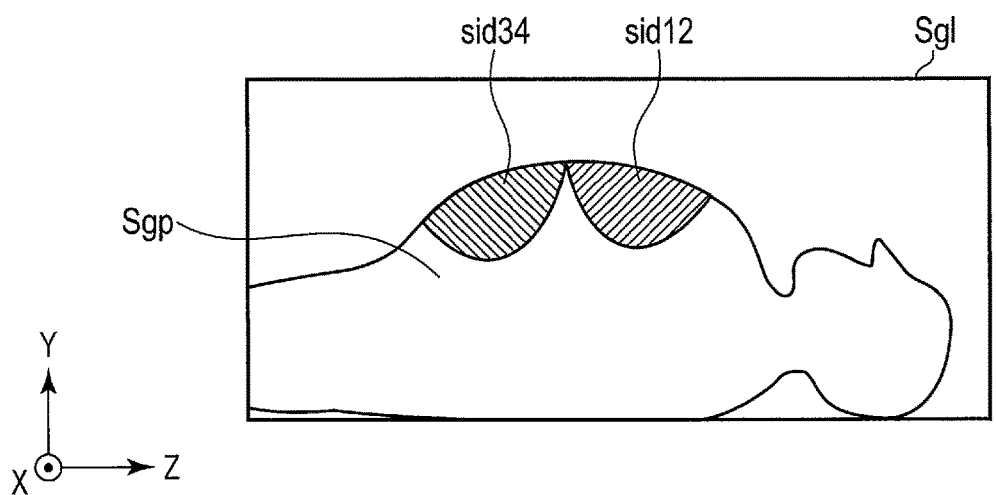
F I G. 11
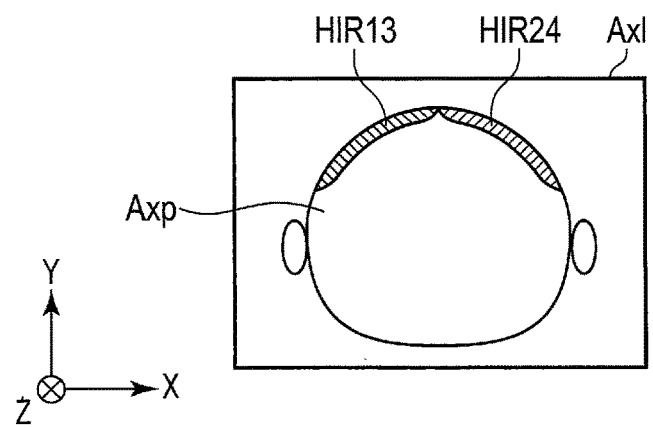
F I G. 12

| DISTANCE FROM TRANSMITTER COIL | 5cm | 10cm | 15cm | 20cm | 25cm | 30cm | 35cm |
|---|---|---|---|---|---|---|---|
| ACCEPTABLE COEFFICIENT | 0.5 | 0.7 | 0.8 | 1 | 1 | 1 | 1 |

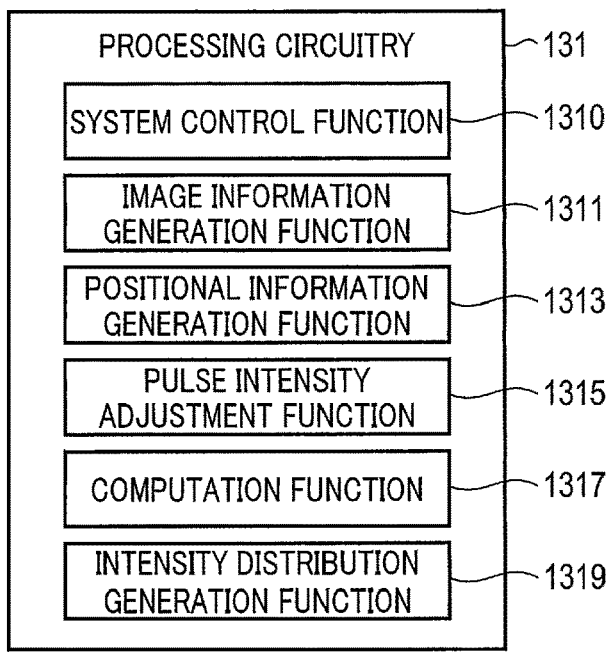
F I G. 16
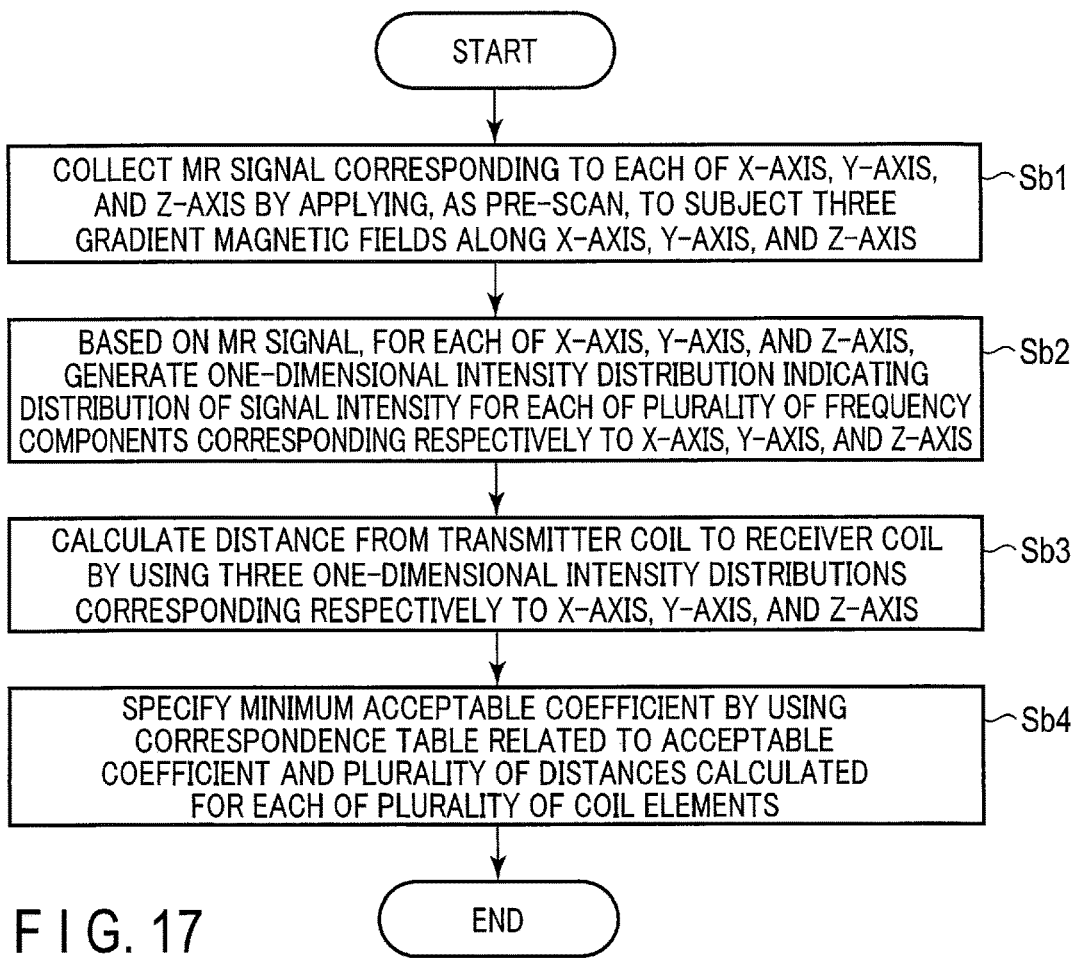
F I G. 17

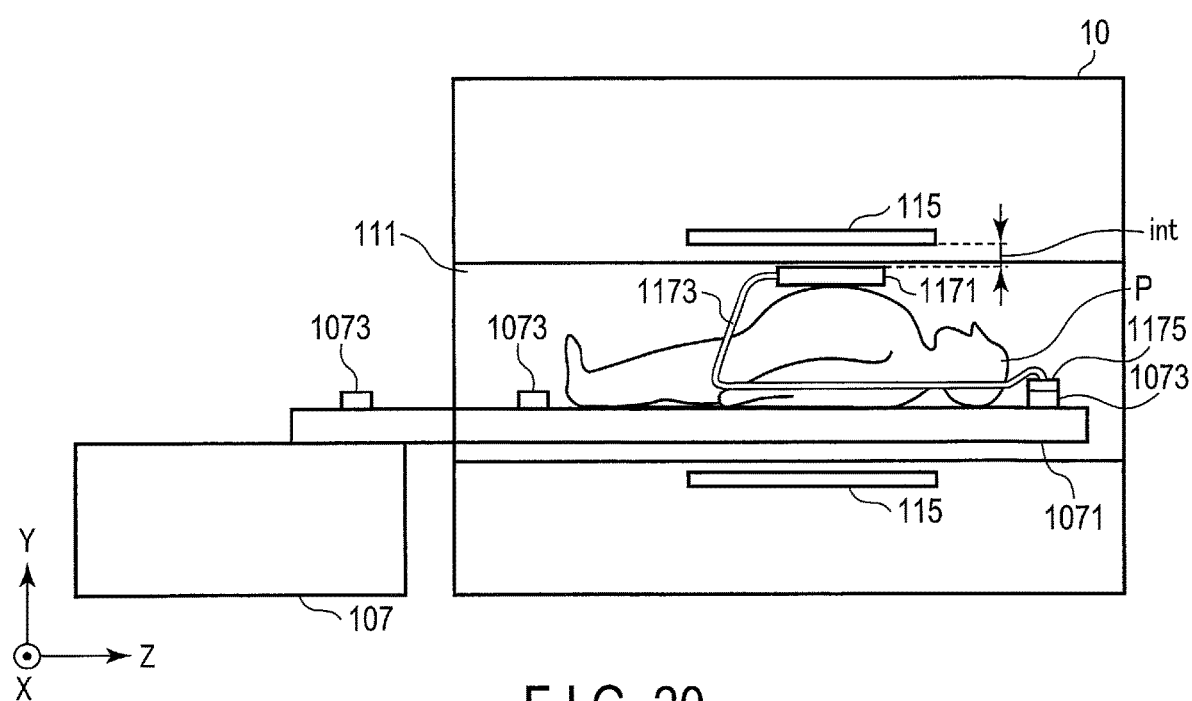
F I G. 20

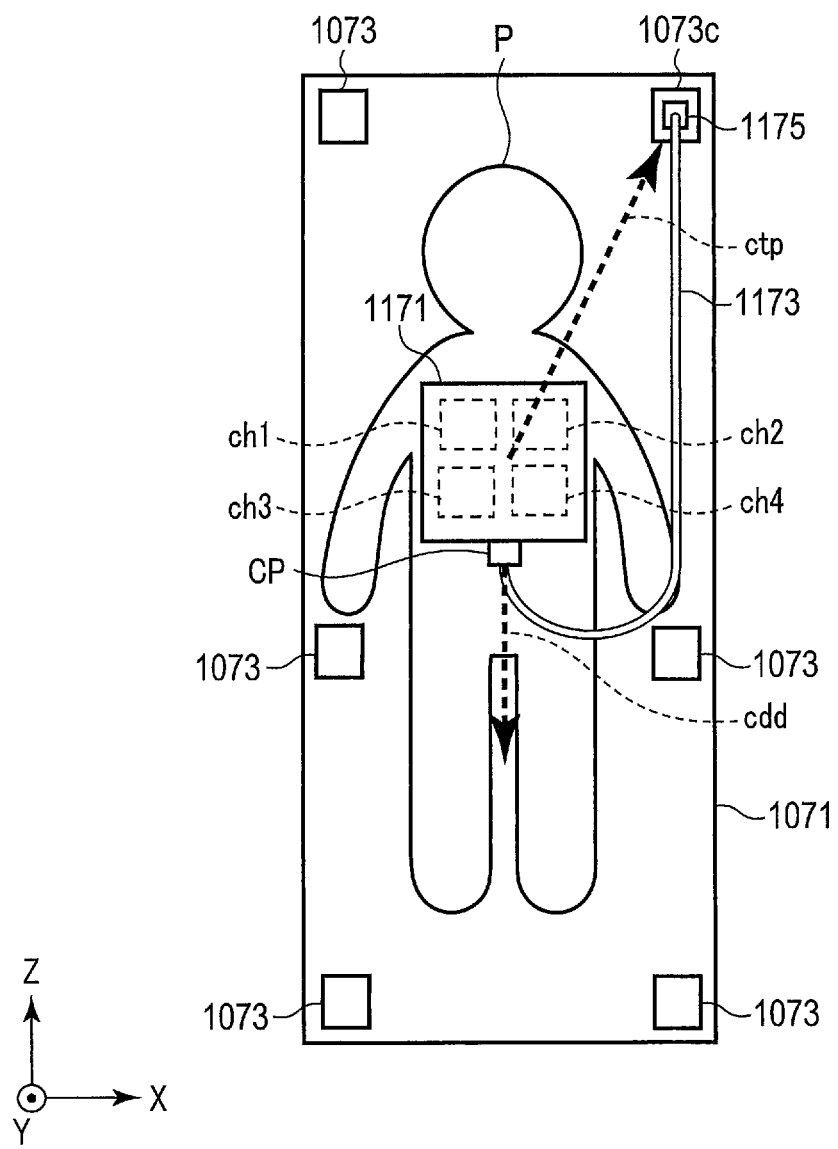
F I G. 21

MAGNETIC RESONANCE IMAGING APPARATUS USING POSITIONAL INFORMATION BASED ON AN IMAGE OBTAINED BY RECONSTRUCTING A MAGNETIC RESONANCE SIGNAL

CROSS-REFERENCE TO RELATED APPLICATIONS

This application is based upon and claims the benefit of priority from the prior Japanese Patent Applications No. 2018-061610, filed Mar. 28, 2018; and No. 2019-45858, filed Mar. 13, 2019, the entire contents of all of which are incorporated herein by reference.

FIELD

Embodiments described herein relate generally to a magnetic resonance imaging apparatus.

BACKGROUND

A conventional magnetic resonance imaging apparatus irradiates a high-frequency magnetic field (hereinafter referred to as an RF pulse) generated by a radio frequency (RF) coil for transmission on a subject, and receives a magnetic resonance signal generated within the subject by a receiver coil in an RF coil apparatus for reception. The RF coil for transmission is arranged inside a gantry of the magnetic resonance imaging apparatus. As the RF coil apparatus for reception, there is a dedicated RF coil apparatus that corresponds to an imaging portion in order to efficiently receive a magnetic resonance signal. Here, the dedicated RF coil apparatus is arranged near the subject. The RF coil apparatus for reception is connected to the magnetic resonance imaging apparatus via a connector provided on an end of a cable in the RF coil apparatus for reception, and a port provided on the magnetic resonance imaging apparatus, and transmits the received magnetic resonance signal to the magnetic resonance imaging apparatus. The port used to connect the RF coil apparatus for reception and the magnetic resonance imaging apparatus is, for example, provided on the gantry or a couch top. The port on the couch top is provided at various positions, such as on a couch side along a longitudinal direction of the couch top, a center portion of the couch top, or on an opposite side of the couch.

The RF pulse generated by the RF coil for transmission is irradiated on the subject, as well as the receiver coil. In order to avoid impact of the RF pulse, the RF coil apparatus for reception includes, for example, circuitry (hereinafter referred to as a decoupling switch) or a balun (balance to unbalance transformer) to decouple the impact of the RF pulse from the receiver coil. Furthermore, to prevent the subject and the receiver coil from being excessively irradiated, the RF pulse transmitted from the RF coil for transmission is limited by a specific absorption rate (SAR), an amplitude of $B_1$ (RF magnetic field), and a value that corresponds to an actual value of $B_1$ and is of $B_{1rms}$ that indicates a root mean square of $B_1$.

As the RF coil apparatus for reception, for example, there is an RF coil apparatus for reception whose position inside a bore is not fixed, and whose position can be changed in accordance with the size, etc., of the subject. In such RF coil apparatus for reception, in a case where the receiver coil is close to the transmitter coil, the impact of the RF pulse may be significant. Furthermore, the RF coil apparatus for reception may receive significant impact of the RF pulse depending on a state of how the cable is arranged from the receiver coil to the port. In such case, heat generated by internal circuitry, such as the decoupling switch and the balun, mounted on the RF coil apparatus for reception, may increase. Furthermore, in the case where a cylindrical magnet is used as a static magnetic field magnet in the magnetic resonance imaging apparatus, when the cable is arranged along a static magnetic field direction, it is difficult for the RF coil apparatus for reception to receive the impact of the RF pulse. On the other hand, in the case where the cable is bent in a U-shape with respect to the static magnetic field direction inside the bore, the heat generated at the internal circuitry in the RF coil apparatus for reception may increase.

To limit the value of $B_{1rms}$ so as to suppress heat generation regardless of the position of the receiver coil inside the bore, or of how the cable is arranged, etc., leads to the limitation on imaging conditions. For example, to limit the value of $B_{1rms}$ leads to reducing the number of slices related to imaging per repetition time (TR), thereby, causing a problem in that extension of imaging time occurs. Furthermore, the guidebook prohibits the RF coil apparatus for reception and the cable from being arranged in a manner that would cause the RF coil apparatus for reception to generate excessive heat by the impact of the RF pulse. However, there is a problem in that in the case where an operator misuses the receiver coil apparatus, there is a risk that excessive heat generation or damage would occur in the RF coil apparatus for reception.

BRIEF DESCRIPTION OF THE DRAWINGS

FIG. 1 is a block diagram showing an entire configuration of a magnetic resonance imaging apparatus according to a present embodiment.

FIG. 5 shows a comparative example of observing a subject inserted inside a bore from a Z-axis direction.

FIG. 6 shows a comparative example of observing a subject inserted inside a bore from an X-axis direction.

FIG. 9 shows an example of a positional relationship of a couch top, the subject, and the receiver coil apparatus according to the present embodiment.

FIG. 10 shows an example of an axial image according to the present embodiment.

FIG. 11 shows an example of a sagittal image according to the present embodiment.

FIG. 12 shows an example of a high-intensity region specified with respect to the axial image in FIG. 10 according to the present embodiment.

FIG. 16 shows an example of a configuration of processing circuitry according to a second modification of the present embodiment.

FIG. 17 shows an example of a process procedure of pulse intensity adjustment processing according to the second modification of the present embodiment.

FIG. 20 shows a subject inserted inside a bore observed from an X-axis direction in the applied example of the present embodiment.

FIG. 21 shows an example of a positional relationship of a subject, a receiver coil, a cable, and a connection port in the applied example of the present embodiment.

DETAILED DESCRIPTION

Figure 2:
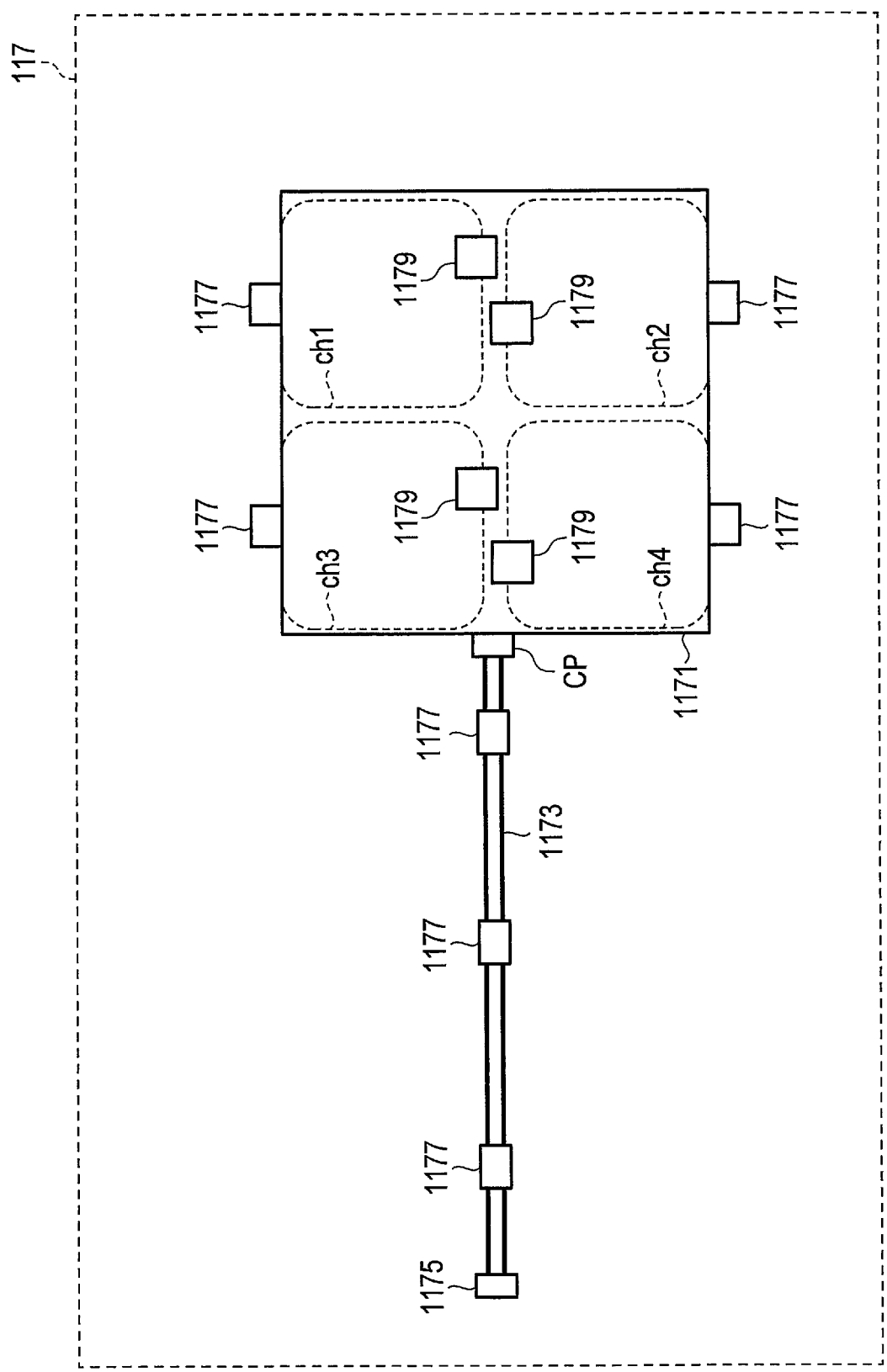
FIG. 2 shows an example of a receiver coil apparatus according to the present embodiment.

A magnetic resonance imaging apparatus according to a present embodiment includes processing circuitry. The processing circuitry generates positional information related to a positional relationship between a transmitter coil and a receiver coil based on a magnetic resonance signal received from a subject. The processing circuitry adjusts an irradiation intensity of an RF pulse to be irradiated on the subject in accordance with the positional information.

The purpose is to adjust the irradiation intensity of the RF pulse in accordance with the position of a receiver coil apparatus inside a bore.

Hereinafter, a present embodiment of the magnetic resonance imaging apparatus will be explained with reference to the drawings. In the explanations below, structural elements having substantially the same functions and configurations will be denoted by the same reference symbols, and repetitive explanations of such elements will be given whenever necessary.

(Embodiment)

FIG. 1 is a block diagram showing an entire configuration of a magnetic resonance imaging (hereinafter referred to as MRI) apparatus 1 according to a present embodiment. The MRI apparatus 1 includes astatic magnetic field magnet 101, a gradient coil 103, a gradient magnetic field power supply 105, a couch 107, couch control circuitry 109, transmit circuitry 113, a transmitter coil 115, a receiver coil apparatus 117, receive circuitry 119, imaging control circuitry (imaging unit) 121, an interface (input unit) 125, a display (display unit) 127, a storage apparatus (storage unit) 129, and processing circuitry (processing unit) 131. A gantry 10 in the MRI apparatus 1 includes the static magnetic field magnet 101, the gradient coil 103, and the transmitter coil 115. The gradient magnetic field power supply 105, the receive circuitry 119, and the imaging control circuitry 121, etc., may also be mounted on the gantry 10. The MRI apparatus 1 may include a hollow cylindrical shim coil between the static magnetic field magnet 101 and the gradient coil 103.

The static magnetic field magnet 101 is, for example, a magnet formed hollow and substantially cylindrical. The static magnetic field magnet 101 generates a uniform static magnetic field in a bore 111, which is a space into which a subject P is inserted. As the static magnetic field magnet 101, for example, a superconducting magnet is used.

The gradient coil 103 is, for example, a coil formed hollow and substantially cylindrical. The gradient coil 103 is arranged on the inner side of the static magnetic field magnet 101. The gradient coil 103 is formed by combining three coils respectively corresponding to X-, Y-, and Z-axes which are orthogonal to each other. A Z-axis direction is a direction that is identical to a direction of the static magnetic field. A Y-axis direction is a vertical direction, and an X-axis direction is a direction perpendicular to the Z-axis direction and the Y-axis direction. The gradient coil 103 generates a gradient magnetic field to be superimposed on the static magnetic field. Specifically, the three coils of the gradient coil 103 individually receive an electric current supply from the gradient magnetic field power supply 105, and generate gradient magnetic fields in which a magnetic field intensity changes along each of the X-, Y-, and Z-axes.

The gradient magnetic field of each of the X-, Y-, and Z-axes that is generated by the gradient coil 103 forms, for example, a gradient magnetic field for frequency encoding (also referred to as a readout gradient magnetic field), a gradient magnetic field for phase encoding, and a gradient magnetic field for slice selection. The gradient magnetic field for frequency encoding is used to change a frequency of a magnetic resonance (hereinafter referred to as MR) signal in accordance with a spatial position. The gradient magnetic field for phase encoding is used to change a phase of the MR signal in accordance with a spatial position. The gradient magnetic field for slice selection is used to determine an imaging slice.

The gradient magnetic field power supply 105 is a power source apparatus that is controlled by the imaging control circuitry 121 to supply a current to the gradient coil 103.

The couch 107 is an apparatus provided with a couch top 1071 on which the subject P is placed. The couch 107 is controlled by the couch control circuitry 109 to insert the top plate 1071 on which the subject P is placed into the bore 111. The couch 107 is installed in, for example, an examination room in such a manner that the longitudinal direction of the couch 107 is parallel to the central axis of the static magnetic field magnet 101.

The couch top 1071 includes a plurality of ports 1073 to which the receiver coil apparatus 117 can be connected. The subject P is placed on the couch top 1071. A connector 1175 provided on one end of a cable 1173 in the receiver coil apparatus 117 is connected to one of the plurality of ports. The port 1073 is not limited to being arranged on the couch top 1071, and may be provided on the couch 107 or the gantry 10, etc. A signal line from the port 1073 is connected to the receive circuitry 119. Although not shown in FIG. 1, in the case where the receiver coil apparatus 117 has a function of transmitting a high-frequency magnetic field, the signal line from the port 1073 is also connected to the transmit circuitry 113 in addition to the receive circuitry 119.

The couch control circuitry 109 is circuitry that controls the couch 107, and drives the couch 107 in response to an operator's instruction via the interface 125 to move the couch top 1071 in a longitudinal direction and a vertical direction, and, in some cases, in a horizontal direction.

The transmit circuitry 113 is controlled by the imaging control circuitry 121 to supply a high-frequency pulse for generating a high-frequency magnetic field (hereinafter referred to as a radio frequency (RF) pulse) corresponding to, such as, the Larmor frequency to the transmitter coil 115.

The transmitter coil 115 is an RF coil that is arranged on the inner side of the gradient coil 103. The transmitter coil 115 receives the high-frequency pulse supplied from the transmit circuitry 113, and generates the RF pulse. The transmitter coil is, for example, a whole body coil (hereinafter referred to as a WB coil). The WB coil may be used as a transmitter/receiver coil.

The receiver coil apparatus 117 includes the receiver coil 1171, the internal circuitry, such as a balance to unbalance transformer (balun) and a decoupling switch, the cable 1173 that is connected to the receiver coil 1171 at one end, and the connector 1175 that is provided on the other end of the cable 1173. The receiver coil apparatus 117 receives an MR signal that is emitted from the subject P by the RF pulse. The receiver coil apparatus 117 outputs the received MR signal to the receive circuitry 119 via the cable 1173 and the connector 1175. The receiver coil apparatus 117 may also transmit the received MR signal wirelessly to the receive circuitry 119 by wireless transmit circuitry (not shown). Here, the cable 1173 and the connector 1175 will be unnecessary in the receiver coil apparatus 117.

The receiver coil 1171 includes, for example, one or more, or typically, a plurality of coil elements. In the following, to provide detailed explanations, the number of coil elements will be explained as four. Four coil elements correspond to, for example, four receive channels. Each of the four coil elements is configured by a loop coil. The MR signal received by each of the four coil elements is output to the receive circuitry 119 in the order (hereinafter referred to as an output sequence) set with respect to each of the four coil elements.

In FIG. 1, the transmitter coil 115 and the receiver coil apparatus 117 are described as being separate RF coils; however, the transmitter coil 115 and the receiver coil apparatus 117 may be implemented as an integrated transmitter/receiver coil. The transmitter/receiver coil is, for example, a local transmitter/receiver RF coil, such as a head coil, that corresponds to an imaging portion.

FIG. 2 shows an example of the receiver coil apparatus 117. As shown in FIG. 2, a balun 1177 and a decoupling switch 1179 are provided on each of the four coil elements (ch1, ch2, ch3, and ch4). The cable 1173 is connected to one side of the receiver coil 1171 adjacent to the coil element ch3 side and the coil element ch4 side. A connection position CP of the receiver coil 1171 and the cable 1173 is not limited to the position shown in FIG. 2, and can be set at any position with respect to the receiver coil 1171.

Each of the four coil elements (ch1, ch2, ch3, and ch4) forms a loop structure when the decoupling switch 1179 is in an off state. Each of the four coil elements receives the MR signals generated from the subject P as a result of applying an RF pulse to the coil element.

The balun 1177 is also provided on the cable 1173 in addition to being provided on each of the four coil elements. The balun 1177 is configured by, for example, resonance circuitry including a condenser and an inductor. The balun 1177 absorbs an unbalanced current the RF pulse causes to flow through each of the plurality of coil elements and the cable 1173 by the resonance circuitry to suppress the unbalanced current in each of the four coil elements and the cable 1173.

Under the control of the imaging control circuitry 121, the decoupling switch 1179 is turned on when the RF pulse is applied to each of the plurality of coil elements, that is, when in an RF transmitting mode. At this time, a loop structure is cut off in each of the plurality of coil elements, and an electric coupling in each of the plurality of coil elements is disconnected. The decoupling switch 1179 is turned off under the control of the imaging control circuitry 121 when in a receiving mode for receiving the MR signal. At this time, each of the plurality of coil elements used for receiving the MR signal forms a loop structure.

Under the control of the imaging control circuitry 121, the receive circuitry 119 generates a digital MR signal which is digitized complex data, based on the MR signal output from the receiver coil apparatus 117. Specifically, the receive circuitry 119 performs various types of signal processing on the MR signal output from the receiver coil apparatus 117, and then performs analog-to-digital (A/D) conversion on the data subjected to the various types of signal processing. By sampling the A/D converted data, the receive circuitry 119 generates the digital MR signal (hereinafter referred to as MR data). The receive circuitry 119 outputs the generated MR data to the imaging control circuitry 121.

The imaging control circuitry 121 controls the gradient magnetic field power supply 105, the transmit circuitry 113, and the receive circuitry 119, etc., in accordance with an imaging protocol output from the processing circuitry 131 to perform imaging on the subject P. The imaging protocol includes various types of pulse sequences in accordance with the examination. The magnitude of the current supplied to the gradient coil 103 by the gradient magnetic field power supply 105, the timing of supplying the current to the gradient coil 103 by the gradient magnetic field power supply 105, the magnitude of the high-frequency pulse supplied to the transmitter coil 115 by the transmit circuitry 113, the timing of supplying the high-frequency pulse to the transmitter coil 115 by the transmit circuitry 113, the timing of receiving the MR signal by the receiver coil 1171, and the timing of turing ON/OFF the decoupling switch 1179, etc., are set in advance in the imaging protocol.

The interface 125 includes circuitry receiving various instructions and information inputs from the operator. The interface 125 includes circuitry related to, for example, a pointing device such as a mouse, or an input device such as a keyboard. The circuitry included in the interface 125 is not limited to one related to physical operating parts such as a mouse and a keyboard. For example, the interface 125 may include processing circuitry of an electrical signal that receives an electrical signal corresponding to an input operation from an external input device provided separately from the MRI apparatus 1, and outputs the received electrical signal to various circuitry.

Under the control of a system control function 1310 in the processing circuitry 131, the display 127 displays, for example, various MR images generated by an image information generation function 1311, and various types of information related to imaging and image processing. The display 127 is, for example, a display device, such as a CRT display, a liquid crystal display, an organic EL display, an LED display, a plasma display, or any other display or monitor known in the relevant technical field.

A storage apparatus 129 stores, for example, MR data filled in a k-space via the image information generation function 1311, and image data generated by the image information generation function 1311. The storage apparatus 129 stores, for example, various imaging protocols, and imaging conditions including a plurality of imaging parameters defining the imaging protocol. The storage apparatus 129 stores programs corresponding to each function executed by the processing circuitry 131. The storage apparatus 129 is, for example, a semiconductor memory element, such as a random access memory (RAM) or a flash memory, a hard disk drive, a solid state drive, or an optical disk. The storage apparatus 129 may also be a driving device, etc., that reads and writes various information to and from portable storage media, such as a CD-ROM drive, a DVD drive, and a flash memory.

The processing circuitry 131 includes, as hardware resources, a processor or a memory such as a read-only memory (ROM) and a RAM (not shown), to control the present MRI apparatus 1. The processing circuitry 131 includes the system control function 1310, the image information generation function 1311, a positional information generation function 1313, a pulse intensity adjustment function 1315, and a computation function 1317. Various functions performed by the system control function 1310, the image information generation function 1311, the positional information generation function 1313, the pulse intensity adjustment function 1315, and the computation function 1317 are stored in the storage apparatus 129 in the form of a program executable by a computer. The processing circuitry 131 is a processor that realizes a function that corresponds to each program by reading a program that corresponds to each of these functions from the storage apparatus 129 and executing it. In other words, the processing circuitry 131 in a state where each of the programs is read includes the plurality of the functions, etc. presented in the processing circuitry 131 of FIG. 1.

In FIG. 1, these functions are explained as being realized in a single processing circuitry 131; however, the functions may also be realized by combining a plurality of independent processors to configure the processing circuitry 131, and executing the programs by each of the processors. In other words, each of the above-described functions may be configured as a program, in which each program is executed by a single processing circuitry, or in which a specific function is implemented in exclusive, independent program-execution circuitry.

The term "processor" means, for example, a CPU (Central Processing Unit), a GPU (Graphical. Processing Unit), an ASIC (Application Specific Integrated Circuit), or a programmable logic device (e.g., an SPLD (Simple Programmable Logic Device), a CPLD (Complex Programmable Logic Device), or an FPGA (Field Programmable Gate Array)).

The processor realizes various functions by reading and executing programs stored in the storage apparatus 129. Instead of storing the program on the storage apparatus 129, the program may be directly incorporated into the circuitry of the processor. In this case, the processor realizes the function by reading and executing the program incorporated into the circuitry. In the same manner, the couch control circuitry 109, the transmit circuitry 113, the receive circuitry 119, and the imaging control circuitry 121, etc., are also configured by electronic circuitry such as the above-described processor. The system control function 1310, the image information generation function 1311, the positional information generation function 1313, the pulse intensity adjustment function 1315, and the computation function 1317 included in the processing circuitry 131 are respectively examples of a system controller, an image generation unit, a positional information generation unit, a pulse intensity adjustment unit, and a computation unit.

The processing circuitry 131 controls various circuitry, etc. in the MRI apparatus 1 by the system control function 1310. Specifically, the processing circuitry 131 reads a system control program stored in the storage apparatus 129, develops it on the memory, and controls each circuitry of the MRI apparatus 1 in accordance with the developed system control program. For example, the processing circuitry 131 reads an imaging protocol from the storage apparatus 129 by the system control function 1310 based on an imaging condition input by the operator via the interface 125. The processing circuitry 131 may generate the imaging protocol based on the imaging condition. The processing circuitry 131 transmits the imaging protocol to the imaging control circuitry 121, and controls various types of imaging on the subject P.

The processing circuitry 131 fills the MR data in the k-space by the image information generation function 1311. The processing circuitry 131 generates an MR image by performing, for example, Fourier transform on the MR data filled in the k-space. The image information generation function 1311, the positional information generation function 1313, the pulse intensity adjustment function 1315, and the computation function 1317 will be explained in the operation described later on.

The above is a schematic explanation regarding the overall configuration of the MRI apparatus 1 of the present embodiment. In addition to the above configuration, the MRI apparatus 1 according to the present embodiment is configured to be able to adjust an irradiation intensity of the RF pulse in accordance with the position of the receiver coil 1171 inside the bore 111.

Figure 3:
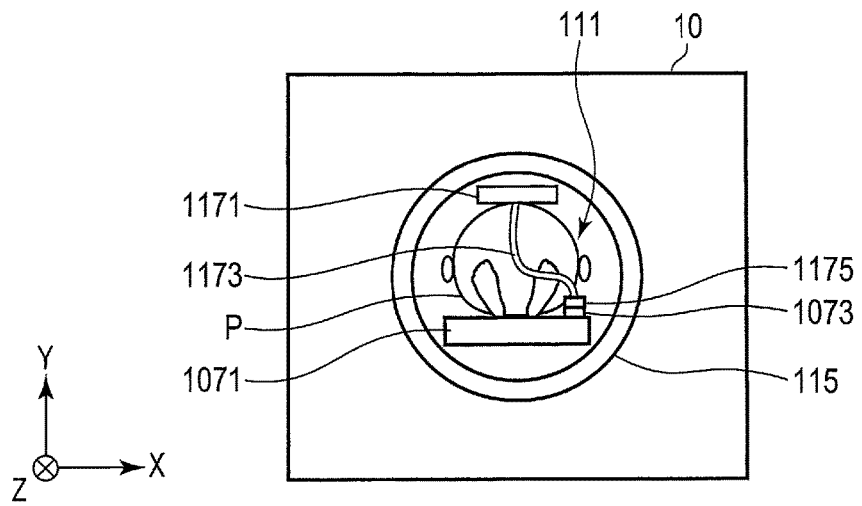
FIG. 3 shows a subject inserted inside a bore observed from a Z-axis direction in the present embodiment.
Figure 4:
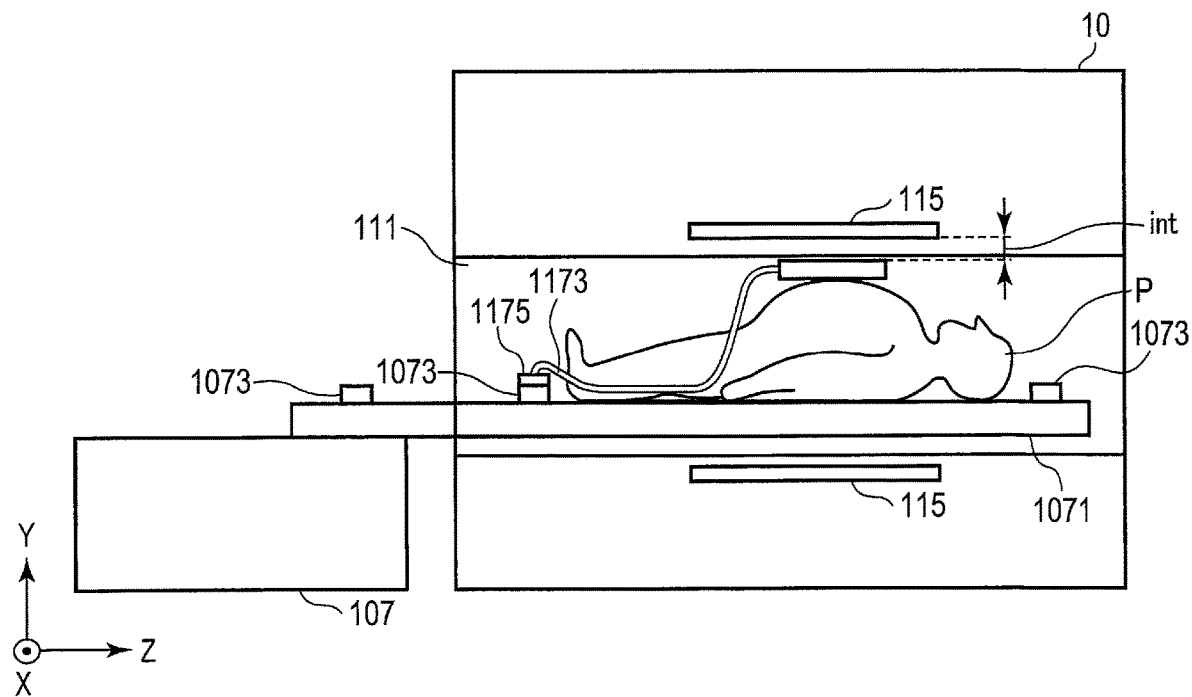
FIG. 4 shows a subject inserted inside a bore observed from an X-axis direction in the present embodiment.

FIG. 3 shows the subject P inserted inside the bore 111 observed from the Z-axis direction in the present embodiment. In addition, FIG. 4 shows the subject P inserted inside the bore 111 observed from the X-axis direction in the present embodiment. FIG. 5 shows a comparative example of the subject P inserted inside the bore 111 observed from the Z-axis direction. In addition, FIG. 6 shows a comparative example of the subject P inserted inside the bore 111 observed from the X-axis direction. In FIG. 3 to FIG. 6, the internal circuitry is not shown.

The receiver coil apparatus 117 is positioned closer to the transmitter coil 115. In the cases shown in FIG. 3 and FIG. 4, a distance int between the receiver coil apparatus 117 and the transmitter coil 115 is less than the distance between the receiver coil apparatus 117 and the transmitter coil 115 in FIG. 5 and FIG. 6. On the other hand, in the cases shown in FIG. 5 and FIG. 6, the receiver coil apparatus 117 is less subject to receiving the impact of the RF pulse applied by the transmitter coil 115. Therefore, in the case of providing the receiver coil apparatus 117 on the subject P in the states shown in FIG. 3 and FIG. 4, the impact of the RF pulse with respect to the receiver coil apparatus 117 becomes stronger than in the cases shown in FIG. 5 and FIG. 6. Therefore, heat generation of the internal circuitry in the receiver coil apparatus 117 shown in FIG. 3 and FIG. 4 becomes greater than that in FIG. 5 and FIG. 6.

Figure 7:
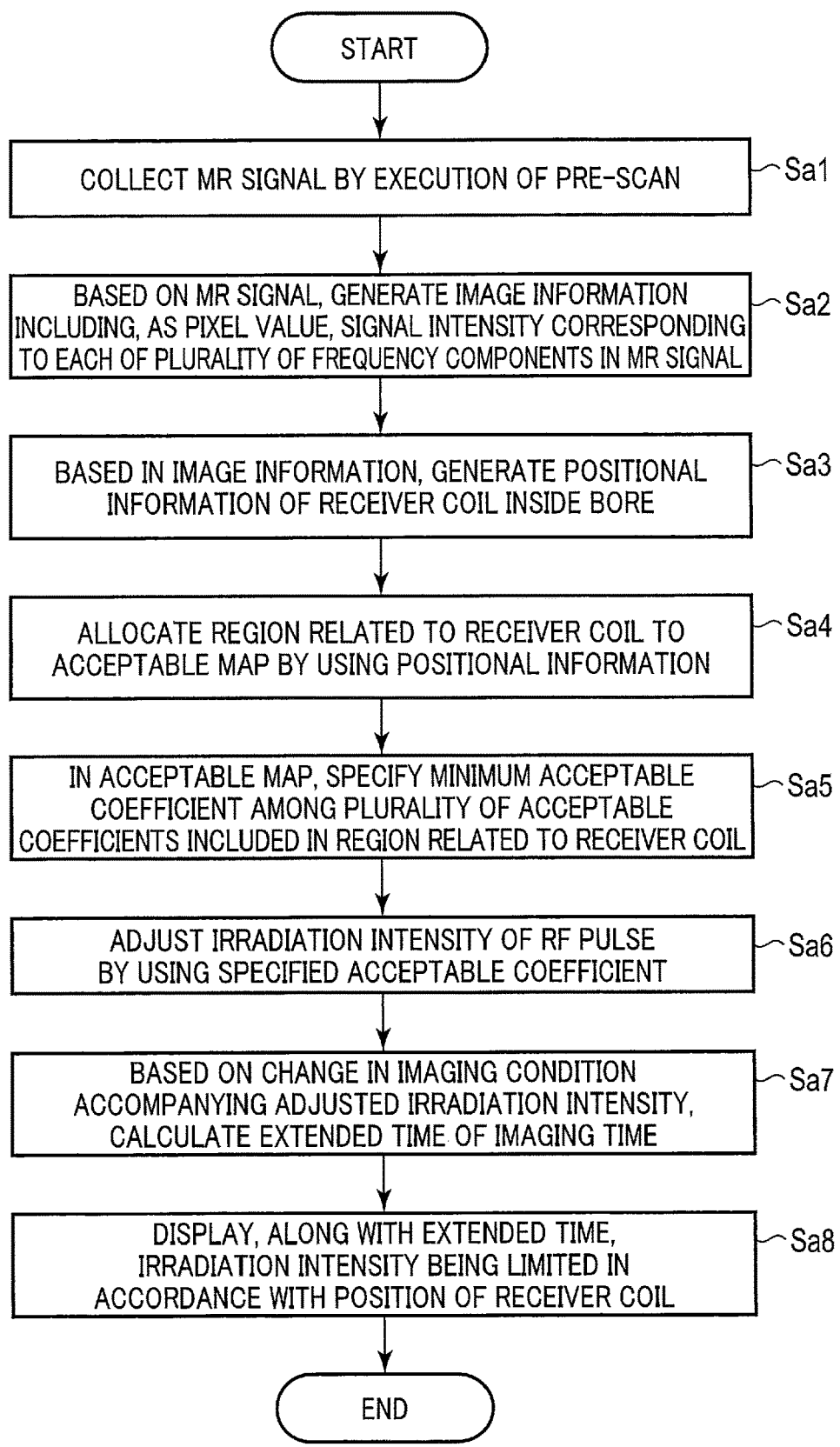
FIG. 7 is a flowchart showing an example of a process procedure related to an irradiation intensity adjustment of an RF pulse according to the present embodiment.

In the following, the operation in the present embodiment will be explained. FIG. 7 is a flowchart showing an example of a processing (hereinafter referred to as pulse intensity adjustment processing) procedure related to the irradiation intensity adjustment of the RF pulse according to the present embodiment. As shown in FIG. 3 to FIG. 6, the pulse intensity adjustment processing is executed in a state where the receiver coil apparatus 117 is arranged with respect to the subject P.

The storage apparatus 129 stores a position of an inner wall of the bore 111 as a coordinate in a coordinate system of a region including the transmitter coil 115 and the bore 111 (hereinafter referred to as a gantry coordinate system). The storage apparatus 129 stores an acceptable map to be used by the pulse intensity adjustment processing. The acceptable map corresponds to, for example, a map in which each of a plurality of acceptable coefficients is allocated to a plurality of positions in a region including the bore 111 in an axial cross-sectional surface perpendicular to the Z-axis direction, that is, to a plurality of coordinates in the gantry coordinate system. Each of the plurality of acceptable coefficients corresponds to, for example, a ratio of an acceptable amount in which an irradiation intensity of the RF pulse is acceptable in a main scan with respect to an amount of the irradiation intensity of the RF pulse. The acceptable coefficient is set in advance for each receiver coil apparatus corresponding to an imaging portion in accordance with a status of heat generation of the internal circuitry, etc., obtained by an experiment or simulation. A value obtained by subtracting the acceptable coefficient from one indicates a ratio in which the irradiation intensity will be limited with respect to a maximum acceptable amount.

Figure 8:
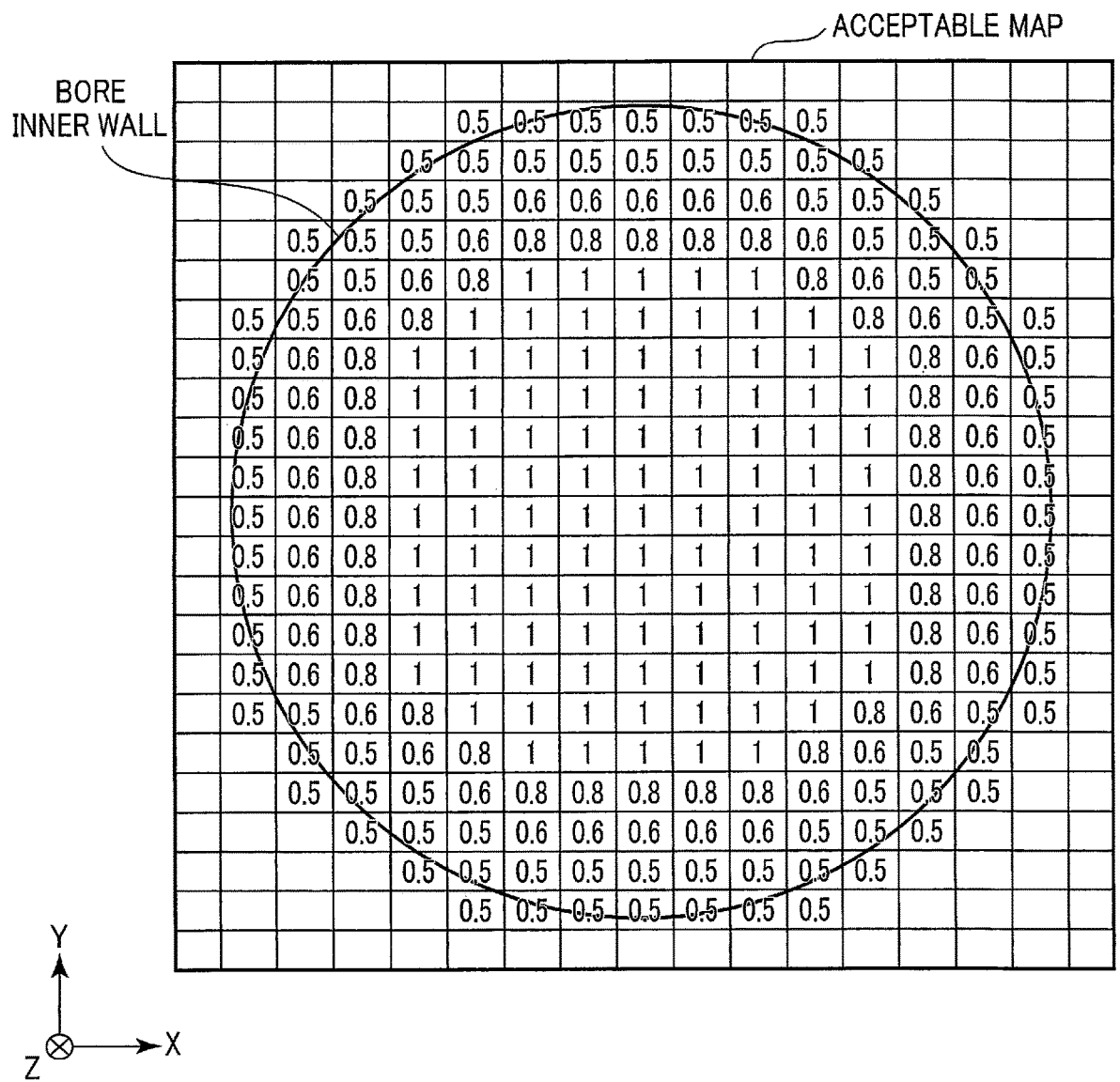
FIG. 8 shows an example of an acceptable map according to the present embodiment.

FIG. 8 is a diagram showing an example of the acceptable map. In FIG. 8, the transmitter coil 115 is positioned on an outer side of a bore inner wall. In FIG. 8, "1" presented in regions including a center position of the bore 111 and a region adjacent to the center position indicates a maximum acceptable amount of the irradiation intensity of the RF pulse. As shown in FIG. 8, the value of the acceptable coefficient decreases as it nears the bore inner wall. That is, the ratio of the acceptable amount of the irradiation intensity with respect to the maximum acceptable amount of the RF pulse decreases as it nears the bore inner wall. In other words, the irradiation intensity with respect to the maximum acceptable amount of the RF pulse becomes more limited as it nears the bore inner wall.

(Pulse Intensity Adjustment Processing)

(Step Sa1)

The receiver coil apparatus 117 is arranged with respect to the subject P placed on the couch top 1071. The connector 1175 at the distal end of the cable 1173 in the receiver coil apparatus 117 is connected to the port 1073 on the couch top 1071. FIG. 9 shows an example of a positional relationship of the couch top 1071, the subject P, and the receiver coil apparatus 117. In the following, various explanations will be provided based on the positional relationship shown in FIG. 9. The status of arrangement between the subject P and the receiver coil apparatus 117 with respect to the couch top 1071 shown in FIG. 9 is an example; therefore, is not limited thereto. In FIG. 9, the internal circuitry is not shown.

The imaging control circuitry 121 collects the MR signal by executing a pre-scan prior to executing the main scan. The pre-scan corresponds to, for example, advance imaging, such as positioning imaging (locator) for obtaining a positioning image that sets an imaging region related to the main scan, and imaging for obtaining a sensitivity map that is used for parallel imaging. In addition, the pre-scan is a scan related to volume imaging with respect to the subject P, such as two-dimensional multi-slice imaging or three-dimensional imaging. Furthermore, since the purpose of the pre-scan is to collect the MR signal, image quality is not an issue, and as long as the MR signal can be collected in a short time, any imaging method may be adopted. The imaging control circuitry 121 adds information that distinguishes the coil elements to the MR signal collected at each of the coil elements, by using the output sequence.

(Step Sa2)

By the image information generation function 1311, the processing circuitry 131 generates (reconstructs) image information based on the collected MR signal. The image information includes, for example, a signal intensity corresponding to each of a plurality of frequency components in the MR signal as a pixel value. Each of the plurality of frequency components corresponds to a magnetic field intensity in a gradient magnetic field of each of the X-, Y-, and Z-axes. Therefore, the frequency component in the MR signal corresponds to a position in the gantry coordinate system.

Specifically, by the image information generation function 1311, the processing circuitry 131 generates a plurality of cross-sectional images (hereinafter referred to as axial images) corresponding to a plurality of slices perpendicular to the Z-axis direction based on the MR signal. The processing circuitry 131 adds a coordinate in a coordinate system with respect to each of a plurality of pixel values in a plurality of axial images based on the gradient magnetic field of each of the X-, Y-, and Z-axes.

FIG. 10 is a diagram showing an example of an axial image AxI. In an axial cross-sectional surface AxP of the subject P shown in FIG. 10, an intensity distribution of the MR signal (hereinafter referred to as a signal distribution) sid13 related to a coil element ch1 or a coil element ch3, and a signal distribution sid24 related to a coil element ch2 or a coil element ch4 are shown.

FIG. 11 shows an example of a sagittal image SgI. In a sagittal cross-sectional surface SgP of the subject P shown in FIG. 11, a signal distribution sid12 related to the coil element ch1 or the coil element ch2, and a signal distribution sid34 related to the coil element ch3 or the coil element ch4 are shown.

As shown in FIG. 10 and FIG. 11, the signal distribution related to each of the plurality of coil elements can be separated in the gantry coordinate system. Therefore, by the image information generation function 1311, in each of a plurality of axial cross-sectional surfaces, the processing circuitry 131 adds a coordinate in the gantry coordinate system to each of the plurality of signal distributions related to the plurality of coil elements in accordance with the position of a pixel.

(Step Sa3)

By the positional information generation function 1313, the processing circuitry 131 generates positional information related to a positional relationship between the transmitter coil 115 and the receiver coil 1171 based on the MR signal received from the subject P. In other words, the processing circuitry 131 generates the positional information of the receiver coil 1171 inside the bore 111 based on the signal intensity corresponding to each of the plurality of frequency components in the MR signal received from the subject P. That is, the processing circuitry 131 generates positional information of the plurality of coil elements inside the bore 111 based on the image information. In other words, the processing circuitry 131 generates the positional information based on an image obtained by reconstructing the MR signal. In the following, detailed explanations will be provided regarding the generation of the positional information.

By the positional information generation function 1313, the processing circuitry 131 specifies a region including a value from a peak value in the signal distribution to a value that is seventy to eighty percent of the peak value (hereinafter referred to as a high-intensity region) in the image information. That is, the processing circuitry 131 specifies the high-intensity region with respect to the signal distribution in each of the plurality of axial images by using the peak value in the signal distribution. By the processing in step Sa2, a plurality of coordinates in the gantry coordinate system are added in the high-intensity region in accordance with the position of the pixel.

FIG. 12 shows an example of a high-intensity region specified with respect to the axial image AxI in FIG. 10. In the axial cross-sectional surface AxP shown in FIG. 12, a high-intensity region HIR13 related to the coil element ch1 or the coil element ch3, and a high-intensity region HIR24 related to the coil element ch2 or the coil element ch4 are shown.

Figure 13:
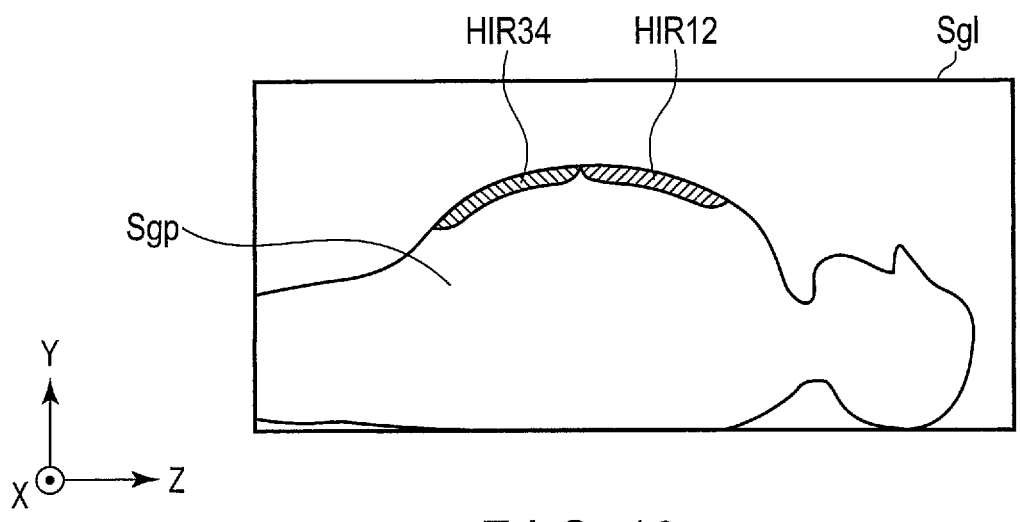
FIG. 13 shows an example of a high-intensity region in the sagittal image in FIG. 11 according to the present embodiment.

FIG. 13 shows an example of a high-intensity region in the sagittal image SgI in FIG. 11. In the sagittal cross-sectional surface SgP shown in FIG. 13, a high-intensity region HIR34 related to the coil element ch3 or the coil element ch4, and a high-intensity region HIR12 related to the coil element ch1 or the coil element ch2 are shown.

According to FIG. 3, FIG. 4, FIG. 9, FIG. 12, and FIG. 13, the receiver coil 1171, that is, a plurality of coil elements, is positioned near the high-intensity region. Therefore, the high-intensity region will be explained as corresponding to a position of the receiver coil 1171, that is, positions of the plurality of coil elements.

By the positional information generation function 1313, the processing circuitry 131 generates a plurality of coordinates corresponding respectively to a plurality of pixels included in the high-intensity region in each of the plurality of axial images as positional information of the receiver coil 1171, that is, as positional information of each of the plurality of coil elements, in the gantry coordinate system. The processing circuitry 131 may generate the positional information in a manner of assuming that the signal distribution corresponds to the position of the receiver coil 1171, without specifying the high-intensity region. Here, as shown in FIG. 9, the processing circuitry 131 generates the plurality of coordinates corresponding respectively to the plurality of pixels included in the signal distribution in each of the plurality of axial images as the positional information of the receiver coil 1171.

(Step Sa4)

By the pulse intensity adjustment function 1315, the processing circuitry 131 allocates a region related to the receiver coil 1171 in the image information to an acceptable map by using the positional information. Specifically, the processing circuitry 131 allocates, in each of the plurality of axial cross-sectional surfaces, the high-intensity region to the acceptable map by using the plurality of coordinates added to the high-intensity region. That is, the processing circuitry 131 superimposes the high-intensity region on the acceptable map across a total number of a plurality of axial cross-sectional surfaces by using the positional information.

Figures 14, 15:
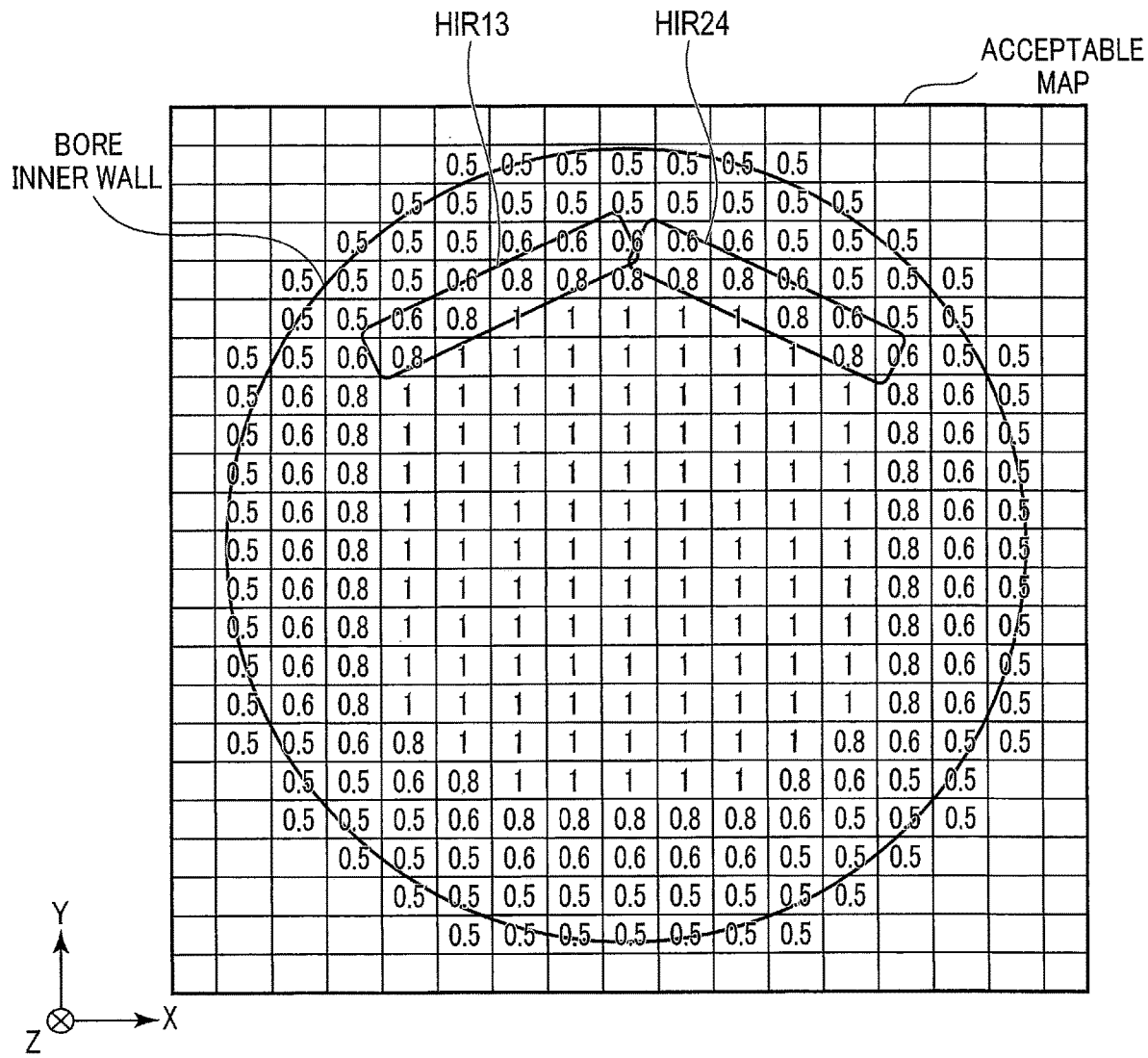
FIG. 14 shows an example of allocating the high-intensity region on the acceptable map by using positional information related to the high-intensity region according to the present embodiment.
FIG. 15 shows an example of a correspondence table of a plurality of acceptable coefficients with respect to a plurality of distances from a transmitter coil in a first modification of the present embodiment.

FIG. 14 shows an example of allocating the high-intensity region HIR13 and the high-intensity region HIR24 on the acceptable map by using the positional information related to the high-intensity region HIR13 and the positional information related to the high-intensity region HIR24. A plurality of numerical values in regions included in the high-intensity region HIR13 and the high-intensity region HIR24 indicate a plurality of acceptable coefficients in the high-intensity region HIR13 and a plurality of acceptable coefficients in the high-intensity region HIR24.

The processing circuitry 131 may also superimpose all of the high-intensity regions across the plurality of axial cross-sectional surfaces on the acceptable map by the pulse intensity adjustment function 1315. Here, in FIG. 14, the high-intensity region HIR13 becomes a region in which all of the high-intensity regions related to the coil element ch1 and the coil element ch3 are integrated, and the high-intensity region HIR24 becomes a region in which all of the high-intensity regions related to the coil element ch2 and the coil element ch4 are integrated. The processing circuitry 131 may allocate the signal distribution, instead of the high-intensity region, to the acceptable map.

(Step Sa5)

The processing circuitry 131 specifies, by the pulse intensity adjustment function 1315, a minimum acceptable coefficient among the plurality of acceptable coefficients included in the region related to the receiver coil 1171 in the acceptable map to which the region related to the receiver coil 1171 is allocated (hereinafter referred to as a region superimposed map). Specifically, the processing circuitry 131 specifies the minimum acceptable coefficient among the plurality of acceptable coefficients included in the plurality of high-intensity regions in a plurality of region superimposed maps corresponding respectively to the plurality of axial cross-sectional surfaces.

Furthermore, in the case where all of the high-intensity regions across the plurality of axial cross-sectional surfaces are allocated to the acceptable map, the processing circuitry 131 specifies the minimum acceptable coefficient among the plurality of acceptable coefficients included in the high-intensity region in this acceptable map. For example, in the case where FIG. 14 shows an example of allocating all of the high-intensity regions across the plurality of axial cross-sectional surfaces to the acceptable map, the processing circuitry 131 specifies the acceptable coefficient of 0.5. In the case where the specified acceptable coefficient is "1", the present pulse intensity adjustment processing is ended.

(Step Sa6)

By the pulse intensity adjustment function 1315, the processing circuitry 131 adjusts the irradiation intensity of the RF pulse related to the main scan by using the specified acceptable coefficient. Specifically, the processing circuitry 131 determines the irradiation intensity of the RF pulse related to the main scan by multiplying the maximum acceptable amount of the irradiation intensity of the RF pulse by the specified acceptable coefficient. In this manner, the acceptable amount of the irradiation intensity of the RF pulse is reduced.

By the pulse intensity adjustment function 1315, the processing circuitry 131 uses the adjusted irradiation intensity to change the imaging condition that is set in advance by the operator, etc., via the interface 125, etc. Specifically, the processing circuitry 131 changes an imaging parameter of the imaging condition in accordance with the irradiation intensity. The changed imaging parameter is a parameter related to the irradiation intensity of the RF pulse, and is, for example, a repetition time (TR), an echo train length (ETL), a refocus RF pulse flip angle, a fat-suppressed pulse intensity, a driven equilibrium (DE) pulse intensity, and a magnetization transfer contrast (MTC) pulse intensity. The processing circuitry 131 changes the imaging condition by changing the imaging parameter.

According to step Sa4 to step Sa6, by the pulse intensity adjustment function 1315, the processing circuitry 131 adjusts the irradiation intensity of the RF pulse to be irradiated on the subject P in accordance with the positional information. For example, the processing circuitry 131 adjusts the irradiation intensity so that the irradiation intensity is lowered the smaller the distance between the transmitter coil 115 and the receiver coil 1171 becomes.

(Step Sa1)

By the computation function 1317, the processing circuitry 131 calculates an extended time of the imaging time based on the change in the imaging condition accompanying the adjusted irradiation intensity. Specifically, the processing circuitry 131 calculates the extended time of the imaging time based on the imaging condition that has been changed in accordance with the adjustment of the irradiation intensity and the imaging condition before the change. For example, the processing circuitry 131 calculates the imaging time in the case of executing the main scan using the imaging condition before the change (hereinafter referred to as time before change). The processing circuitry 131 then calculates the imaging time in the case of executing the main scan using the imaging condition after the change (hereinafter referred to as time after change). The processing circuitry 131 calculates the extended time by subtracting the time before change from the time after change.

(Step Sa8)

By the pulse intensity adjustment function 1315, the processing circuitry 131 outputs to the display 127 a message that the irradiation intensity is limited in accordance with the position of the receiver coil 1171, that is, the position of the coil element. The display 127 displays the message output from the processing circuitry 131. The processing circuitry 131 outputs the calculated extended time on the display. The display 127 displays the above message together with the extended time.

By the pulse intensity adjustment function 1315, the processing circuitry 131 may also output to the display 127 the imaging conditions before and after the change, the imaging parameters before and after the change, and the image in which the high-intensity region is allocated to the acceptable map. Here, the display 127 displays the imaging conditions before and after the change, the imaging parameters before and after the change, and the image in which the high-intensity region is allocated to the acceptable map, etc., together with the above message and extended time.

After the present step, when an instruction to start the main scan is input via the input interface 125, the processing circuitry 131 outputs the changed imaging condition to the imaging control circuitry 121 by the system control function 1310. The imaging control circuitry 121 executes the main scan in accordance with the changed imaging condition.

According to the above-described configuration, the following advantageous effects can be obtained.

According to the MRI apparatus 1 of the present embodiment, the positional information of the receiver coil 1171 inside the bore 111 can be generated based on the signal intensity corresponding to each of the plurality of frequency components in the MR signal received from the subject P to adjust the irradiation intensity of the RF pulse to be irradiated on the subject P based on the positional information.

That is, according to the present MRI apparatus 1, the positional information related to the positional relationship between the transmitter coil 115 and the receiver coil 1171 can be generated based on the MR signal received from the subject P to adjust the irradiation intensity of the RF pulse to be irradiated on the subject P in accordance with the positional information. Furthermore, according to the present MRI apparatus 1, the distance between the transmitter coil 115 and the receiver coil 1171 can be used as the positional relationship. According to the present MRI apparatus 1, the positional information can also be generated based on the image obtained by reconstructing the MR signal. Therefore, according to the present MRI apparatus 1, the irradiation intensity can be adjusted to be lowered the smaller the distance between the transmitter coil 115 and the receiver coil 1171 becomes.

More specifically, according to the present MRI apparatus, the irradiation intensity can be adjusted by generating the image information including a pixel value corresponding to the signal intensity based on the MR signal, generating a plurality of coordinates related to the position of the receiver coil 1171 by using the coordinate system related to a region including the bore 111 and the image information as the positional information, allocating the region related to the receiver coil 1171 to the acceptable map in which a plurality of acceptable coefficients indicating the degree of acceptance of the irradiation intensity are corresponded to each of the plurality of coordinates in the coordinate system using the plurality of coordinates, and by using the minimum acceptable coefficients among the plurality of acceptable coefficients included in the region related to the receiver coil 1171.

Furthermore, the present MRI apparatus 1 is capable of displaying that the irradiation intensity is limited in accordance with the position of the receiver coil by adjusting the irradiation intensity. In addition, according to the present MRI apparatus 1, the extended time of the imaging time can be calculated based on the imaging condition that is changed in accordance with the adjustment of the irradiation intensity and the imaging condition before the change, and be displayed.

Therefore, according to the present MRI apparatus 1, an optimum irradiation intensity in the main scan can be determined without excessively limiting the irradiation intensity of the RF pulse in accordance with the receiver coil apparatus 117 inside the bore 111, and by reducing the risk of damaging the receiver coil 1171 and the internal circuitry, etc.

That is, according to the present MRI apparatus 1, by taking into consideration the various setting states of the receiver coil apparatus 117 inside the bore 111, the RF coil apparatus 1117 would not need to be overly protected with respect to the high-frequency magnetic field when a receiver coil 1171 is assumed to be in an arrangement where the heat generated at the receiver coil 1171 and the internal circuitry is low. Therefore, the main scan can be executed under an imaging condition where the limitation with respect to the high-frequency magnetic field is eased.

Furthermore, according to the present MRI apparatus 1, when a receiver coil 1171 is assumed to be in an arrangement where the heat generated at the receiver coil 1171 and the internal circuitry is high, the main scan can be executed under an imaging condition with a strict limitation on the high-frequency magnetic field, that is, under an imaging condition in which the irradiation intensity of the RF pulse is reduced. Therefore, even in a case where the operator makes a mistake in setting the receiver coil apparatus 117, the main scan can be safely executed without damaging the receiver coil apparatus 117.

Furthermore, according to the present MRI apparatus 1, a message that the receiver coil apparatus 117 is in a setting where it may receive great impact from the high-frequency magnetic field can be presented to the operator.

In addition, according to the present MRI apparatus 1, that a stricter limitation on the imaging condition caused by the receiver coil apparatus 117 arrangement has caused the imaging time to be extended can be presented to the operator. That is, by providing information that may be of reference to the operator upon resetting the receiver coil apparatus 117 inside the bore 111, the operator will be able to decide on the option of whether to edit the imaging condition, or to reset the receiver coil apparatus 117, which will improve throughput of the examination.

(First Modification)

The difference between the present modification and the embodiment is that the present modification calculates a distance from a transmitter coil 115 to a receiver coil 1171 as positional information by using image information, and determines a minimum acceptable coefficient by using the calculated distance and a correspondence table (a look-up table) of a plurality of acceptable coefficients with respect to a plurality of distances from the transmitter coil 115. A positional relationship is, for example, a distance between the transmitter coil 115 and the receiver coil 1171.

A storage apparatus 129 stores the above correspondence table. The storage apparatus 129 stores a position of the transmitter coil 115 as a coordinate in a gantry coordinate system. FIG. 15 shows an example of the above correspondence table. As shown in FIG. 15, the acceptable coefficient decrease as the position of the receiver coil becomes closer to the transmitter coil 115. That is, as it gets closer to the transmitter coil 115, a limitation on a maximum acceptable amount of irradiation intensity of an RF pulse becomes stricter. The correspondence table shown in FIG. 15 corresponds to that obtained by converting the acceptable map shown in FIG. 8 into a relationship of the acceptable coefficient with respect to a distance from a transmitter coil.

In the following, regarding pulse intensity adjustment processing in the present modification, details that differ from the processing in step Sa3 to step Say in the above embodiment will be explained.

(Pulse Intensity Adjustment Processing)

(Step Sa3)

By a positional information generation function 1313, processing circuitry 131 calculates a distance from the transmitter coil 115 to the receiver coil 1171 with respect to each of a plurality of pixels in the image information by using the image information. As shown in FIG. 3 and FIG. 5, the transmitter coil 115 is arranged on an outer side of a bore inner wall, in a manner surrounding a bore 111. Therefore, the processing circuitry 131 calculates, for each of a plurality of pixels in a signal distribution, a shortest distance from a coordinate of the transmitter coil 115 to a coordinate of each of these pixels. Specifically, the processing circuitry 131 calculates the shortest distance for each pixel by optimization processing that uses a calculation equation for obtaining a distance between the two points from the transmitter coil 115 to the pixel.

(Step Sa4)

By a pulse intensity adjustment function 1315, the processing circuitry 131 determines a plurality of acceptable coefficients that correspond respectively to a plurality of pixels in a signal distribution by collating the calculated distance with the correspondence table.

(Step Sa5)

By the pulse intensity adjustment function 1315, the processing circuitry 131 specifies a minimum acceptable coefficient among a plurality of determined acceptable coefficients. The specified acceptable coefficient corresponds to a pixel that is closest to the transmitter coil 115.

According to the above-described configuration, the following advantageous effects can be obtained.

According to an MRI apparatus 1 in the present modification, image information that includes, as a pixel value, signal intensity corresponding to each of a plurality of frequency components in an MR signal received from a subject P is generated based on the MR signal; the image information is used to calculate a distance from the transmitter coil 115 to the receiver coil 1171 for irradiating an RF pulse to the subject P with respect to each of a plurality of pixels in the image information as positional information of the receiver coil 1171 inside the bore 111; the correspondence table of a plurality of acceptable coefficients indicating the degree of acceptance of irradiation intensity with respect to a plurality of distances from the transmitter coil 115 and the calculated distance are used to determine a plurality of acceptable coefficients corresponding respectively to the plurality of pixels; and the irradiation intensity is adjusted by using a minimum acceptable coefficient among the determined plurality of acceptable coefficients. The explanation on other advantageous effects will be omitted since they are similar to those of the embodiment.

(Second Modification)

The difference between the present modification and the embodiment is that, based on an MR signal corresponding to each of the three gradient magnetic fields related to three different axes, the present modification generates, for every three axes, a one-dimensional intensity distribution indicating a distribution of signal intensities for each of a plurality of frequency components corresponding respectively to the three axes, and generates positional information based on the one-dimensional intensity distribution (one-dimensional profile) for every three axes. Hereinafter, to provide detailed explanations, the three different axes will be considered as an X-axis, a Y-axis, and a Z-axis. However, the three different axes will not be limited to the X-axis, the Y-axis, and the Z-axis.

Regarding configurations and pulse intensity adjustment processing in the present modification, matters that differ from the above embodiment will be explained. FIG. 16 shows an example of a configuration of processing circuitry 131 according to the present modification. The processing circuitry 131 further includes an intensity distribution generation function 1319. The intensity distribution generation function 1319 is stored in a storage apparatus 129 in the form of a program executable by a computer. The intensity distribution generation function 1319 included in the processing circuitry 131 is an example of an intensity distribution generation unit. Processing details related to the intensity distribution generation function 1319 will be explained in a process procedure of pulse intensity adjustment processing in the present modification.

FIG. 17 shows an example of a process procedure of the pulse intensity adjustment processing in the present modification. In the pulse intensity adjustment processing, step Sb1 to step Sb4 in FIG. 17 are replaced by step Sa1 to step Sa5 in FIG. 7 of the present embodiment. That is, in FIG. 17, the processing subsequent to step Sb4 is the processing after step Sa6 in FIG. 7.

(Pulse Intensity Adjustment Processing)

(Step Sb1)

Prior to executing a pre-scan in the present modification, a receiver coil apparatus 117 is arranged with respect to a subject P placed on a couch top 1071. To avoid overlapped explanations, the arrangement status of the receiver coil apparatus 117 in the present modification will be considered the same as that in FIG. 9.

Imaging control circuitry 121 collects an MR signal corresponding to each of the X-axis, the Y-axis, and the Z-axis by applying each of the three gradient magnetic fields along the X-axis, the Y-axis, and the Z-axis to the subject P as a pre-scan. That is, the imaging control circuitry 121 executes a line-scan with respect to each of the X-axis, the Y-axis, and the Z-axis. The pre-scan in the present modification corresponds to, for example, a scan that is used for selecting a coil element used for a main-scan in a plurality of coil elements. Since the purpose of the pre-scan in the present modification is to collect the MR signal, image quality is not an issue, and as long as the MR signal can be collected in a short time, any imaging method may be adopted.

Specifically, the imaging control circuitry 121 collects the MR signal (hereinafter referred to as an X-axis MR signal) by applying the gradient magnetic field along the X-axis (hereinafter referred to as an X-axis gradient magnetic field) to the subject P as a readout gradient magnetic field. The imaging control circuitry 121 collects the MR signal (hereinafter referred to as a Y-axis MR signal) by applying the gradient magnetic field along the Y-axis (hereinafter referred to as a Y-axis gradient magnetic field) to the subject P as a readout gradient magnetic field. The imaging control circuitry 121 collects the MR signal (hereinafter referred to as a Z-axis MR signal) by applying the gradient magnetic field along the Z-axis (hereinafter referred to as a Z-axis gradient magnetic field) to the subject P as a readout gradient magnetic field.

(Step Sb2)

By the intensity distribution generation function 1319, the processing circuitry 131 generates a one-dimensional intensity distribution indicating a distribution of the signal intensity for each of a plurality of frequency components corresponding respectively to the X-axis, the Y-axis, and the Z-axis based on the MR signal. Specifically, by executing a Fourier transform with respect to the X-axis MR signal, the processing circuitry 131 generates a distribution of an intensity of the X-axis MR signal (hereinafter referred to as an X-axis intensity distribution) with respect to a frequency related to the X-axis gradient magnetic field (hereinafter referred to as an X-axis frequency). By executing a Fourier transform with respect to the Y-axis MR signal, the processing circuitry 131 generates a distribution of an intensity of the Y-axis MR signal (hereinafter referred to as a Y-axis intensity distribution) with respect to a frequency related to the Y-axis gradient magnetic field (hereinafter referred to as a Y-axis frequency). By executing a Fourier transform with respect to the Z-axis MR signal, the processing circuitry 131 generates a distribution of an intensity of the Z-axis MR signal (hereinafter referred to as a Z-axis intensity distribution) with respect to a frequency related to the Z-axis gradient magnetic field (hereinafter referred to as a Z-axis frequency). Each of the X-axis intensity distribution, the Y-axis intensity distribution, and the Z-axis intensity distribution corresponds to the above-described one-dimensional intensity distribution. The X-axis frequency, the Y-axis frequency, and the Z-axis frequency correspond respectively to a position on the X-axis, a position on the Y-axis, and a position on the Z-axis.

Figure 18:
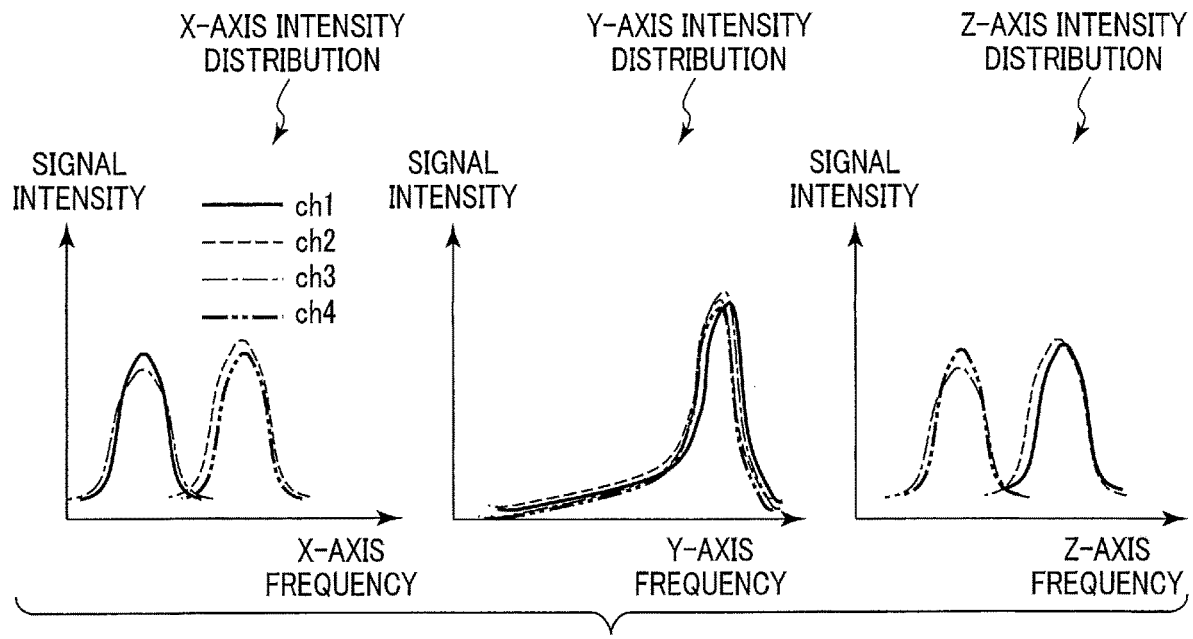
FIG. 18 shows an example of an X-axis intensity distribution, a Y-axis intensity distribution, and a Z-axis intensity distribution related to each of the four coil elements in the second modification of the present embodiment.

FIG. 18 shows an example of the X-axis intensity distribution, the Y-axis intensity distribution, and the Z-axis intensity distribution regarding each of the four coil elements (ch1, ch2, ch3, and ch4). The X-axis intensity distribution, the Y-axis intensity distribution, and the Z-axis intensity distribution differ for each coil element in accordance with the positions of the four coil elements, etc., inside the bore 111.

(Step Sb3)

By a positional information generation function 1313, the processing circuitry 131 calculates the distance from a transmitter coil 115 to a receiver coil 1171 by using three one-dimensional intensity distributions corresponding respectively to the X-axis, the Y-axis, and the Z-axis. Specifically, the processing circuitry 131 specifies, for each coil element, the X-axis frequency that corresponds to a peak of a signal intensity in the X-axis intensity distribution, or the X-axis frequency that corresponds to a center of gravity in the X-axis intensity distribution. The processing circuitry 131 specifies, for each coil element, the Y-axis frequency that corresponds to a peak of a signal intensity in the Y-axis intensity distribution, or the Y-axis frequency that corresponds to a center of gravity in the Y-axis intensity distribution. The processing circuitry 131 specifies, for each coil element, the Z-axis frequency that corresponds to a peak of a signal intensity in the Z-axis intensity distribution, or the Z-axis frequency that corresponds to a center of gravity in the Z-axis intensity distribution.

By the positional information generation function 1313, the processing circuitry 131 converts each of the specified X-axis frequency, the specified Y-axis frequency, and the specified Z-axis frequency into coordinates (hereinafter referred to as element coordinates) in a gantry coordinate system. The element coordinate corresponding to each of a plurality of coil elements corresponds to a position of each of the plurality of coil elements. The processing circuitry 131 calculates a distance from a position of the transmitter coil 115 to a position of each of the coil elements by using the coordinate of the transmitter coil 115 and the element coordinate in the gantry coordinate system. Since the calculated distance is the same as the shortest distance in the first modification, the explanation will be omitted. By the above-described processing, the processing circuitry 131 generates a plurality of shortest distances corresponding to each of the plurality coil elements as positional information of the receiver coil 1171 by using the X-axis intensity distribution, the Y-axis intensity distribution, and the Z-axis intensity distribution.

(Step Sb4)

By a pulse intensity adjustment function 1315, the processing circuitry 131 specifies a minimum acceptable coefficient by using a correspondence table related to the acceptable coefficient, that is, the correspondence table shown in FIG. 15, and the plurality of shortest distances calculated for each of the plurality of coil elements. Specifically, the processing circuitry 131 determines the plurality of acceptable coefficients corresponding respectively to the plurality of shortest distances by collating the correspondence table with the plurality of shortest distances. The processing circuitry 131 then specifies a minimum acceptable coefficient among the plurality of determined acceptable coefficients.

According to the above-described configuration, the following advantageous effects can be obtained.

According to the MRI apparatus 1 in the present modification, based on an MR signal corresponding to each of the three gradient magnetic fields related to three different axes, a one-dimensional intensity distribution indicating a distribution of a signal intensity for each of a plurality of frequency components corresponding respectively to the three axes is generated for every three axes, and positional information can be generated based on the one-dimensional intensity distribution for every three axes. That is, according to the present MRI apparatus 1, positional information can be generated by obtaining a one-dimensional profile of a magnetic resonance signal in three axial directions formed by a gradient magnetic field. According to the MRI apparatus in the present modification, even in the case of executing a line-scan as a pre-scan, an optimum irradiation intensity of the RF pulse can be determined. The explanation on other advantageous effects will be omitted since they are similar to those of the embodiment.

(Applied Example)

The difference between the applied example and the embodiment is that the applied example determines whether or not an arrangement of a cable 1173 inside a bore 111 is in a U-shape based on positional information of a receiver coil 1171 inside the bore 111, a direction in which the cable 1173 is derived from the receiver coil 1171 (hereinafter referred to as a deriving direction), and a position of a port to which a connector 1175 is connected (hereinafter referred to as a connection port) among a plurality of ports 1073; and, in the case where the arrangement is determined as being in a U-shape, adjusts an irradiation intensity of an RF pulse to be used in a main scan.

Figure 19:
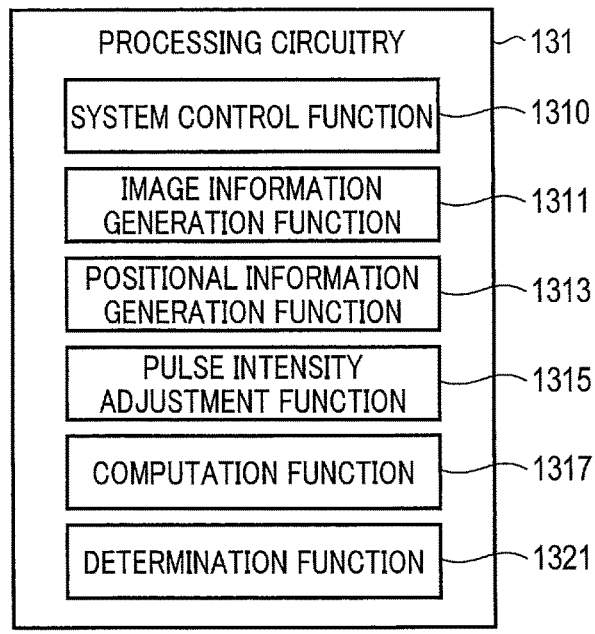
FIG. 19 shows an example of a configuration of processing circuitry according to an applied example of the present embodiment.

FIG. 19 shows an example of a configuration of processing circuitry 131 according to the present applied example. The processing circuitry 131 further includes a determination function 1321. The determination function 1321 is stored in a storage apparatus 129 in the form of a program executable by a computer. Processing details regarding the determination function 1321 will be explained later on. The determination function 1321 included in the processing circuitry 131 is an example of a determination unit.

FIG. 20 shows a subject P inserted inside a bore 111 observed from an X-axis direction regarding the present applied example. FIG. 21 shows a positional relationship of a subject P, a receiver coil 1171, a cable 1173, and a connection port 1073c observed from a Z-axis direction regarding the present applied example. As shown in FIG. 20 and FIG. 21, the arrangement of the cable 1173 inside the bore 111 is in a U-shape. In FIG. 20 and FIG. 21, internal circuitry is not shown.

The storage apparatus 129 stores the deriving direction at each of a plurality of receiver coil apparatuses according to an imaging portion. For example, in FIG. 2, the deriving direction corresponds to a direction in which the cable 1173 is derived from a connection position CP, that is, a direction of a tangent direction of the cable 1173 at the connection position CP that departs from the receiver coil 1171. The deriving direction is irrelevant to a gantry coordinate system, and is a direction set with respect to the receiver coil apparatus 117. The storage apparatus 129 stores positions of a plurality of ports 1073 to which the connector 1175 is connected as coordinates of the plurality of ports 1073 in the gantry coordinate system. The storage apparatus 129 also stores a position of the connection port 1073c, that is, a coordinate in the gantry coordinate system. In the case where a couch top 1071 is inserted into a bore, the storage apparatus 129 updates and stores the coordinate of the connection port 1073c in accordance with the position of the couch top 1071.

In the case where the arrangement of the cable 1173 inside the bore 111 is in a U-shape, the storage apparatus 129 stores a limitation coefficient for limiting the irradiation intensity of the RF pulse by corresponding it to each of a plurality of receiver coil apparatuses in accordance with an imaging portion. The limitation coefficient is a positive decimal number that is not more than one, and is set in advance for each receiver coil apparatus corresponding to the imaging portion in accordance with the status of heat generated in the internal circuitry, etc., by an experiment or a simulation in the case where the arrangement of the cable 1173 inside the bore ill is in a U-shape.

Figure 22:
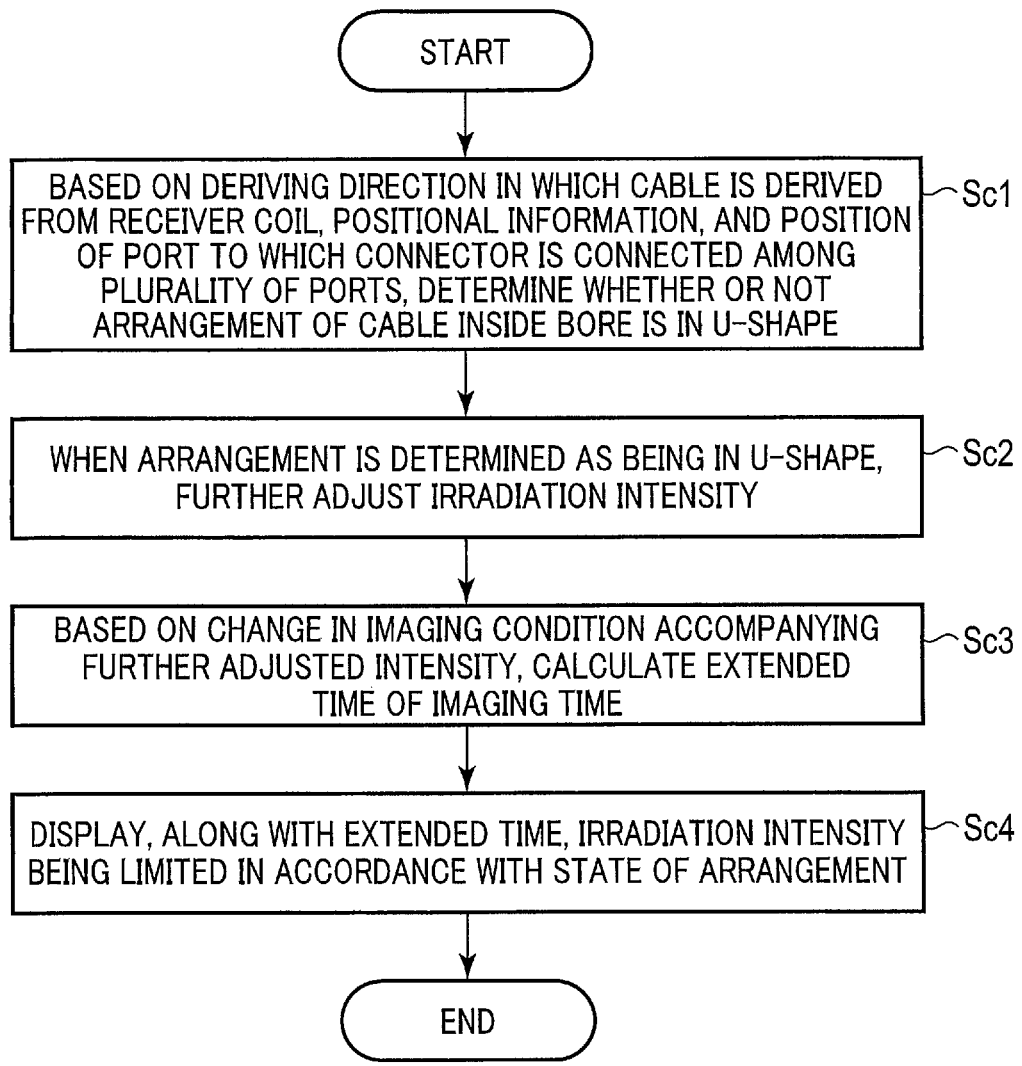
FIG. 22 shows an example of a process procedure of pulse intensity adjustment processing in the applied example of the present embodiment.

FIG. 22 shows an example of a process procedure of pulse intensity adjustment processing in the present applied example. The pulse intensity adjustment processing in the present applied example is, for example, executed after step Sa6 in FIG. 7 of the present embodiment. The processing in step Sc1 to step Sc4 in FIG. 22 may be executed after step Sa3. In the following, the pulse intensity adjustment processing in the present applied example will be explained based on the arrangement of the cable 1173 shown in FIG. 20 and FIG. 21.

(Pulse Intensity Adjustment Processing)
(Step Sc1)
By the determination function 1321, the processing circuitry 131 determines whether or not the arrangement of the cable 1173 inside the bore 111 is in a U-shape based on the deriving direction, the positional information, and the position of the connection port 1073c to which the connector 1175 is connected. In the case where the positions of four coil elements with respect to the subject P are arranged in a manner shown in FIG. 21, the positional relationship of the signal distribution along the Z-axis direction (static magnetic field direction) will have a coil element ch1 and a coil element ch2 on the head side of the subject P, and a coil element ch3 and a coil element ch4 on the foot side of the subject P. On the other hand, the deriving direction stored in association with the receiver coil apparatus 117 in the storage device 129 is directed towards the coil elements ch3 and ch4 from the coil elements ch1 and ch2 as shown in FIG. 2. Therefore, the processing circuitry 131 determines the presence of the U-shape by using a relative positional relationship between a plurality of coil elements and the connection port 1073c, and the deriving direction.

Based on the positions of the plurality of coil elements and the deriving direction, in FIG. 20 and FIG. 21, a direction (hereinafter referred to as a cable direction) in which the cable 1173 projects from the receiver coil 1171 is a direction on the foot side of the subject P in the gantry coordinate system. As shown in FIG. 20 and FIG. 21, since the connection port 1073c is on the head side of the subject P, and the cable direction is on the foot side of the subject P in the gantry coordinate system, the processing circuitry 131 determines that the arrangement of the cable 1173 inside the bore 111 is in a U-shape.

For example, by the determination function 1321, the processing circuitry 131 determines the cable direction by associating the deriving direction with the gantry coordinate system using the positional information of the receiver coil 1171, such as the coordinate of each of the coil elements. The processing circuitry 131 determines the coordinate of the receiver coil apparatus 117 by averaging a plurality of coordinates corresponding respectively to the plurality of coils elements. The coordinate of the receiver coil apparatus 117 corresponds to, for example, a center of gravity coordinate obtained by the plurality of coil elements. The processing circuitry 131 calculates a port direction that is directed towards the connection port 1073c from the receiver coil apparatus 117 by using the coordinate of the receiver coil apparatus 117 and the coordinate of the connection port 1073c. The cable direction corresponds to an arrow cdd shown in FIG. 21, and the port direction corresponds to an arrow ctp shown in FIG. 21.

The processing circuitry 131 calculates an inner product of a vector indicating the cable direction and a vector indicating the port direction by the determination function 1321. Whether or not the inner product is negative corresponds to whether or not the cable direction faces the connection port 1073c. In the case where the calculated inner product is negative, the processing circuitry 131 determines that the arrangement of the cable 1173 inside the bore 111 is in a U-shape. In the case where the calculated inner product is not negative, the processing circuitry 131 determines that the arrangement of the cable 1173 inside the bore 111 is not in a U-shape. The above explanation is an example; therefore, as long as the cable direction can be determined as to whether or not it is facing the connection port 1073c, the explanation is not limited thereto.

In the case where the arrangement of the cable 1173 inside the bore 111 is determined as being in a U-shape, the processing circuitry 131 reads out the limitation coefficient corresponding to the receiver coil apparatus 117 that is connected to the connection port 1073c from the storage apparatus 129 by the determination function 1321. In the case where the arrangement of the cable 1173 inside the bore 111 is not determined as being in a U-shape, the present pulse intensity adjustment processing is ended.

(Step Sc2)

The processing circuitry 131 further adjusts the irradiation intensity by the pulse intensity adjustment function 1315. Specifically, the processing circuitry 131 further adjusts the irradiation intensity of the RF pulse related to the main scan by multiplying the irradiation intensity adjusted in the processing of step Sa6 by the read out limitation coefficient. The processing circuitry 131 changes an imaging condition by using a further adjusted irradiation intensity.

(Step Sc3)

The processing circuitry 131 calculates, by the computation function 1317, an extended time of an imaging time based on the change in the imaging condition accompanying the further adjusted irradiation intensity. Since the processing details in the present step are similar to those in step Sa7, the explanation will be omitted.

(Step Sc4)

By the pulse intensity adjustment function 1315, the processing circuitry 131 outputs to a display 127 a message that the irradiation intensity is limited in accordance with the state of the arrangement of the cable 1173. The display 127 displays the message that the irradiation intensity is limited in accordance with the state of the arrangement of the cable 1173. The processing circuitry 131 outputs the calculated extended time to the display. The display 127 displays the above message together with the extended time.

According to the above-described configuration, the following advantageous effects can be obtained.

The MRI apparatus 1 in the present applied example comprises a receiver coil apparatus 117 including a receiver coil 1171, a cable 1173 that is connected to the receiver coil 1171 and transmits an MR signal, and a connector 1175 provided at one end of the cable 1173, and a plurality of ports 1037 connectable to the receiver coil apparatus 117 and to which the MR signal is input via the connector 1175. In the case where the arrangement of the cable 1173 inside a bore 111 is determined as being in a U-shape based on a direction in which the cable 1173 is derived from the receiver coil 1171, a position of a port 1073c to which the connector 1175 is connected among a plurality of ports 1073, and positional information, the irradiation intensity can be adjusted.

Therefore, according to the present MRI apparatus 1, the risk of damaging the receiver coil 1171 and the internal circuitry, etc., is reduced in accordance with the position of the receiver coil apparatus 117 inside the bore 111 and the arrangement of the cable inside the bore, which allows to determine an optimum irradiation intensity in the main scan. In other words, according to the MRI apparatus 1 in the present applied example, even if the arrangement of the cable 1173 inside the bore 111 were not an ideal arrangement, that is, the cable 1173 is not arranged in a manner with the lowest risk of generating heat in the internal circuitry, etc., by performing the pulse intensity adjustment processing (adjustment processing of $B_1$ intensity), the main scan can be executed without having to reset the arrangement of the receiver coil apparatus 117 or the arrangement of the cable 1173 inside the bore 111. Therefore, according to the present MRI apparatus 1, the time required to carry out a work flow prior to executing the main scan can be shortened.

Furthermore, according to the present MRI apparatus 1, it is possible to display that, by adjusting the irradiation intensity, the irradiation intensity may be limited in accordance with the state of arrangement. For example, according to the present MRI apparatus 1 in the present applied example, along with the extended time, it is possible to display a message such that the irradiation intensity is limited in accordance with the arranged state of the cable 1173, or that the irradiation intensity is limited in accordance with the position of the receiver coil 1171, that is, the position of the coil element. This allows the operator to easily change the imaging condition, change the arrangement of the receiver coil apparatus 117, change the arrangement of the cable 1173, and ease the limitation on the high-frequency magnetic field, etc. For example, in the case where the extended time displayed on the display 127 is five minutes or less, the operator is able to shorten the extended time by changing the imaging condition. If the extended time displayed on the display 127 is five minutes or more, and it is possible to reset at least one of the receiver coil apparatus 117 or the arrangement of the cable 1173, the operator is able to execute resetting at least one of the arrangement of the receiver coil apparatus 117 or the arrangement of the cable 1173.

(Third Modification)

The difference between the present modification and the embodiment is that the present modification adjusts an irradiation intensity by using a setting value related to transmission of an RF pulse (hereinafter referred to as a transmission setting value) in accordance with positional information. The transmission setting value corresponds to, for example, a phase of an RF pulse and an amplitude of the RF pulse that are determined in accordance with an imaging portion of a subject P. The transmission setting value relates to a spatial distribution of the transmission intensity of the RF pulse (hereinafter referred to as a transmission intensity distribution).

A storage apparatus 129 stores a map (hereinafter referred to as a revision map) for revising an acceptable map in accordance with the transmission setting value. The revision map is used in a case where the transmission intensity distribution is asymmetrical with respect to a center position of a bore 111, to reflect the asymmetry property of the transmission intensity distribution on the acceptable map. For example, the revision map includes a coefficient (hereinafter referred to as a revision coefficient) by which the acceptable map is multiplied at each of a plurality of coordinates. Instead of the revision coefficient, however, the revision map may also include a coefficient to be subtracted from the acceptable map, or a coefficient to be added to the acceptable map at each of the plurality of coordinates. In the following, in order to provide specific explanations, the revision map will be explained as including revision coefficients at each of the plurality of coordinates.

Specifically, the storage apparatus 129 stores a plurality of revision maps corresponding to each of the plurality of transmission setting values. For example, in the case where a transmitter coil 115 is configured by a plurality of coil elements, the storage apparatus 129 stores a plurality of revision maps in accordance with a combination of a plurality of transmission setting values corresponding respectively to each of the plurality of coil elements. The storage device 129 stores a correspondence table of the transmission setting value with respect to a shape (that changes depending on a body height, a body weight, and an imaging portion, etc.) of an imaging portion (hereinafter referred to as a portion setting value correspondence table).

An interface 125 inputs the imaging portion with respect to the subject P. In the present modification, the imaging portion is input at a stage prior to step Sa1 in the pulse intensity adjustment processing.

By a pulse intensity adjustment function 1315, a processing circuitry 131 collates the imaging portion with the portion setting value correspondence table to determine the transmission setting value. In the present modification, the transmission setting value is determined as appropriate in the processing at a stage prior to step Sa4 in the pulse intensity adjustment processing. The processing circuitry 131 may also determine the transmission setting value by using a $B_1$ map generated by a pre-scan with respect to the subject P to equalize the transmission intensity distribution inside the subject (that is, by $B_1$ shimming). In such case, the portion setting value correspondence table becomes unnecessary, and the transmission setting value is determined as appropriate in the processing at a stage after the processing of step Sa1 and prior to step Sa4. The pre-scan related to generating the $B_1$ map is executed by imaging control circuitry 121 by using a sequence that would not affect a receiver coil 1171.

The processing circuitry 131 adjusts the irradiation intensity by the pulse intensity adjustment function 1315 based on positional information related to a positional relationship between the transmitter coil 115 and the receiver coil 1171 and the transmission setting value. Specifically, the processing circuitry 131 specifies the revision map corresponding to the transmission setting value from a plurality of revision maps stored in the storage device 129. The processing circuitry 131 then generates a revised acceptable map (hereinafter referred to as a revision acceptable map) by multiplying the acceptable map by the specified revision map. The processing circuitry 131 allocates a region (or a high-frequency region) related to the receiver coil 1171 to the revision acceptable map. The processing of generating the revision acceptable map and allocating a region to the revision acceptable map described above is performed instead of the processing of step Sa4 in the pulse intensity adjustment processing. In the pulse intensity adjustment processing in the present modification, the processing after step Say is similar to the pulse intensity adjustment processing described in the embodiment. Therefore, the explanation thereof will be omitted.

The processing circuitry 131 may also generate the transmission intensity distribution based on the transmission setting value, and generate the revision map based on the generated transmission intensity distribution by the pulse intensity adjustment function 1315. Specifically, the processing circuitry 131 calculates the transmission intensity distribution by applying the transmission setting value to a power supply point in the transmitter coil 115. The processing circuitry 131 then generates the revision map by standardizing values in the entire area of the transmission intensity distribution so that a value at a center position of the generated transmission intensity distribution becomes one.

According to the above-described configuration, the following advantageous effects can be obtained.

According to an MRI apparatus 1 in the present modification, the irradiation intensity can be adjusted by using the setting value related to the transmission of the RF pulse. In the above manner, the irradiation intensity can be adjusted for each imaging portion or for each result of the $B_1$ shimming, and, by reducing the risk of damaging the receiver coil 1171 and the internal circuitry, etc., without excessively limiting the irradiation intensity of the RF pulse, a further optimum irradiation intensity can be determined in the main scan. Explanations on other advantageous effects will be omitted since they are similar to those of the embodiment.

(Fourth Modification)

The difference between the present modification and the embodiment is that the present modification generates positional information of a receiver coil 1171 inside a bore 111 without using an MR signal. An MRI apparatus 1 according to the present modification includes, for example, a plurality of cameras (not shown). Each of the plurality of cameras is provided, for example, at a position where images can be captured from different directions inside the bore 111. The different directions are, for example, three directions. The plurality of cameras are, for example, optical cameras.

Prior to a main scan, each of the plurality of cameras captures an image of a receiver coil apparatus 117 that is provided on a subject P inserted inside the bore 111. The plurality of cameras generate, for example, each of a plurality of images (hereinafter referred to as an optical image) including the receiver coil apparatus 117 inside the bore 111. The plurality of cameras output each of the plurality of optical images to the processing circuitry 131.

A storage apparatus 129 stores a coordinate of each of the plurality of cameras (hereinafter referred to as a camera coordinate) in a gantry coordinate system.

The processing circuitry 131 generates positional information of the receiver coil 1171 inside the bore 111 by a positional information generation function 1313 based on the plurality of optical images. For example, the processing circuitry 131 extracts a region of the receiver coil apparatus 117 (hereinafter referred to as a coil apparatus region) in the plurality of optical images by executing existing segmentation processing and recognition processing, etc., in each of the plurality of optical images. The processing circuitry 131 then generates the positional information of the receiver coil 1171 inside the bore 111 by using the position of a plurality of receiver coils 1171 in the receiver coil apparatus 117, a coil apparatus extraction region, and the camera coordinate.

The processing of capturing an image of the receiver coil apparatus 117 inside the bore 111 and generating positional information of the receiver coil 1171 inside the bore 111 is executed instead of the processing in step Sa1 to step Sa3 in pulse intensity adjustment processing. In the pulse intensity adjustment processing related to the present modification, the processing after step Sa4 is similar to the pulse intensity adjustment processing described in the first modification. Therefore, the explanation thereof will be omitted.

According to the above-described configuration, the following advantageous effects can be obtained.

According to an MRI apparatus 1 in the present modification, the positional information of the receiver coil 1171 inside the bore 111 can be generated, and an irradiation intensity of an RF pulse to be irradiated on the subject P can be adjusted based on the positional information. Explanations on other advantageous effects will be omitted since they are similar to those of the first modification.

According to a magnetic resonance imaging apparatus 1 of the embodiments, etc., described above, the irradiation intensity of the RF pulse can be adjusted in accordance with the position of the receiver coil apparatus 117 inside the bore ill.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising processing circuitry that
   generates positional information related to a positional relationship between a transmitter coil and a receiver coil based on a magnetic resonance signal received from a subject, and
   adjusts an irradiation intensity of an RF pulse to be irradiated on the subject in accordance with the positional information, wherein the processing circuitry generates the positional information based on an image obtained by reconstructing the magnetic resonance signal.

2. The magnetic resonance imaging apparatus according to claim 1, wherein the positional relationship is a distance between the transmitter coil and the receiver coil.

3. The magnetic resonance imaging apparatus according to claim 1, wherein the processing circuitry adjusts the irradiation intensity by using a setting value related to the RF pulse.

4. The magnetic resonance imaging apparatus according to claim 1, wherein the processing circuitry adjusts the irradiation intensity in a manner that the irradiation intensity is lowered the smaller the distance between the transmitter coil and the receiver coil becomes.

5. The magnetic resonance imaging apparatus according to claim 1, wherein
   the processing circuitry
   generates image information that includes, as a pixel value, a signal intensity corresponding to each of a plurality of frequency components in the magnetic resonance signal based on the magnetic resonance signal,
   calculates a distance from the transmitter coil to the receiver coil as the positional information with respect to each of a plurality of pixels in the image information by using the image information,
   determines a plurality of acceptable coefficients corresponding respectively to the plurality of pixels by using the calculated distance and a correspondence table of a plurality of acceptable coefficients indicating a degree of acceptance of the irradiation intensity with respect to a plurality of distances from the transmitter coil, and
   adjusts the irradiation intensity by using a minimum acceptable coefficient among the determined plurality of acceptable coefficients.

6. The magnetic resonance imaging apparatus according to claim 1, wherein
   the processing circuitry
   generates image information that includes a pixel value corresponding to a signal intensity corresponding to each of a plurality of frequency components in the magnetic resonance signal,
   generates a plurality of coordinates related to a position of the receiver coil as the positional information by using the image information and a coordinate system related to a region including a bore,
   allocates a region related to the receiver coil, by using the plurality of coordinates, to an acceptable map in which a plurality of acceptable coefficients indicating an acceptable degree of the irradiation intensity are corresponded respectively to a plurality of coordinates in the coordinate system, and
   adjusts the irradiation intensity by using a minimum acceptable coefficient among a plurality of acceptable coefficients included in a region related to the receiver coil.

7. The magnetic resonance imaging apparatus according to claim 1, further comprising:
   a receiver coil apparatus including the receiver coil, a cable that is connected to the receiver coil and transmits the magnetic resonance signal, and a connector provided at one end of the cable; and
   a plurality of ports that are connectable to the receiver coil apparatus, and to which the magnetic resonance signal is input via the connector, wherein
   the processing circuitry
   determines whether or not an arrangement of the cable inside a bore is in a U-shape based on a direction in which the cable is derived from the receiver coil, a position of a port to which the connector is connected among the plurality of ports, and the positional information, and
   adjusts the irradiation intensity in the case where the arrangement is determined as being in the U-shape.

8. The magnetic resonance imaging apparatus according to claim 7, further comprising a display displaying that the irradiation intensity is limited in accordance with a state of the arrangement of the cable by an adjustment of the irradiation intensity.

9. The magnetic resonance imaging apparatus according to claim 1, further comprising:
   a receiver coil apparatus including the receiver coil, a cable that is connected to the receiver coil and transmits the magnetic resonance signal, and a connector provided at one end of the cable; and
   a plurality of ports that are connectable to the receiver coil apparatus, and to which the magnetic resonance signal is input via the connector, wherein
   the processing circuitry
   determines whether or not an arrangement of the cable inside the bore is in a U-shape based on a direction in which the cable is derived from the receiver coil, a position of a port to which the connector is connected among the plurality of ports, and the positional information, and
   adjusts the irradiation intensity in the case where the arrangement is determined as being in the U-shape.

10. A magnetic resonance imaging apparatus comprising processing circuitry that
    generates positional information related to a positional relationship between a transmitter coil and a receiver coil based on a magnetic resonance signal received from a subject, and
    adjusts an irradiation intensity of an RF pulse to be irradiated on the subject in accordance with the positional information, wherein the processing circuitry generates the positional information by obtaining a one-dimensional profile of the magnetic resonance signal in three axial directions formed by a gradient magnetic field.

11. A magnetic resonance imaging apparatus comprising processing circuitry that
    generates positional information related to a positional relationship between a transmitter coil and a receiver coil based on a magnetic resonance signal received from a subject, and adjusts an irradiation intensity of an RF pulse to be irradiated on the subject in accordance with the positional information, wherein the apparatus further comprises a display displaying that the irradiation intensity is limited in accordance with a position of the receiver coil by an adjustment of the irradiation intensity.

12. The magnetic resonance imaging apparatus according to claim 11, wherein
the processing circuitry calculates an extended time of an imaging time based on an imaging condition changed in accordance with the irradiation intensity adjustment and an imaging condition before the change, and
the display displays the extended time.

13. A magnetic resonance imaging apparatus comprising processing circuitry that
generates positional information of a receiver coil inside a bore based on an image obtained by reconstructing a magnetic resonance signal, and
adjusts an irradiation intensity of an RF pulse to be irradiated on a subject based on the positional information.

14. The magnetic resonance imaging apparatus according to claim 13, wherein the positional relationship is a distance between the transmitter coil and the receiver coil.

15. The magnetic resonance imaging apparatus according to claim 13, wherein the processing circuitry adjusts the irradiation intensity by using a setting value related to the RF pulse.

16. The magnetic resonance imaging apparatus according to claim 13, wherein the processing circuitry adjusts the irradiation intensity in a manner that the irradiation intensity is lowered the smaller the distance between the transmitter coil and the receiver coil becomes.

* * * * *